United States Patent
Nasu et al.

(10) Patent No.: US 7,106,978 B2
(45) Date of Patent: *Sep. 12, 2006

(54) OPTICAL MODULE, OPTICAL TRANSMISSION APPARATUS, WDM OPTICAL TRANSMISSION DEVICE, AND METHOD FOR STABILIZING LASER WAVELENGTH

(75) Inventors: Hideyuki Nasu, Tokyo (JP); Takehiko Nomura, Tokyo (JP); Kumiko Imai, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 662 days.

This patent is subject to a terminal disclaimer.

(21) Appl. No.: 10/266,784

(22) Filed: Oct. 9, 2002

(65) Prior Publication Data
US 2003/0108353 A1    Jun. 12, 2003

(30) Foreign Application Priority Data
Oct. 9, 2001    (JP)    ............................. 2001-312060

(51) Int. Cl.
H04B 10/04    (2006.01)
(52) U.S. Cl. ............................ 398/196; 398/95; 372/32
(58) Field of Classification Search ................ 398/195, 398/196, 197, 198, 95; 372/32, 34
See application file for complete search history.

(56) References Cited

U.S. PATENT DOCUMENTS 5,867,513 A * 2/1999 Sato ............................ 372/32
6,516,010 B1 * 2/2003 Broutin et al. ........... 372/29.01
6,549,549 B1 * 4/2003 Mousseaux et al. .......... 372/32
6,822,986 B1 * 11/2004 Nasu et al. .................... 372/32
6,856,633 B1 * 2/2005 Nasu et al. .................... 372/34

FOREIGN PATENT DOCUMENTS

| EP | 1 069 658 |   | 1/2001 |
| JP | 02299277 A | * | 12/1990 |
| JP | 2000-56185 |   | 2/2000 |

* cited by examiner

Primary Examiner—Christina Y. Leung
(74) Attorney, Agent, or Firm—Oblon, Spivak, McClelland, Maier & Neustadt, P.C.

(57) ABSTRACT

An optical module according to the present invention includes: a light-emitting device that outputs laser light; a temperature adjustment unit that adjusts a wavelength of the laser light outputted from the light-emitting device so as to be locked at a predetermined wavelength; a wavelength monitor unit that receives laser light outputted from the light-emitting device by allowing the laser light to pass through an optical filter provided above the temperature adjustment unit and monitors the wavelength thereof; a package for sealing the light-emitting device, the temperature adjustment unit, and the wavelength monitor unit into the inside thereof; and a package temperature detection unit for detecting a temperature of the package, in which the temperature adjustment unit adjusts an oscillation wavelength of the laser light outputted from the light-emitting device to the predetermined lock wavelength based on a signal outputted from the wavelength monitor unit, and a signal from the package temperature detection unit is used to correct the lock wavelength shift caused by temperature characteristics of the optical filter by estimating the optical filter temperature based on the detected package temperature.

17 Claims, 24 Drawing Sheets

OPTICAL MODULE, OPTICAL TRANSMISSION APPARATUS, WDM OPTICAL TRANSMISSION DEVICE, AND METHOD FOR STABILIZING LASER WAVELENGTH

BACKGROUND OF THE INVENTION

1. Field of the Invention

The present invention relates to an optical module, an optical transmitter, and a WDM optical transmission apparatus utilized in a WDM (wavelength division multiplexing) communication system, and a laser light wavelength stabilizing method.

2. Description of the Related Art

In the field of dense WDM, it is generally required that the optical signals are stable in wavelength for a long time period. Consequently, there have conventionally been developed techniques of providing the function of a wavelength monitor in an optical module.

SUMMARY OF THE INVENTION

An optical module of the present invention includes:

a light-emitting device that outputs laser light;

a wavelength adjustment unit that adjusts a wavelength of the laser light outputted from the light-emitting device so as to be within a predetermined wavelength range;

a wavelength monitor unit that monitors the wavelength of the laser light outputted from the light-emitting device by receiving the laser light passed through an optical filter;

a package that accommodates the light-emitting device, the wavelength adjustment unit, and the wavelength monitor unit; and a package temperature detection unit that detects a temperature of the package.

An optical transmitter of the present invention includes:

an optical module including a light-emitting device that outputs laser light, a wavelength adjustment unit that adjusts a wavelength of the laser light outputted from the light-emitting device so as to be within a predetermined wavelength range, a wavelength monitor unit that has the laser light outputted from the light-emitting device pass through an optical filter, receives the laser light having passed therethrough, and monitors the wavelength of the received laser light, a package that accommodates the light-emitting device, the wavelength adjustment unit, and the wavelength monitor unit, and a package temperature detection unit that detects a temperature of the package;

a control unit that stabilizes a light-emission wavelength of the laser light outputted from the light-emitting device to be within the predetermined wavelength range based on a signal outputted from the wavelength monitor unit; and a correction unit that estimates a temperature of the optical filter based on the temperature of the package detected by the package temperature detection unit and outputs, to the control unit, a correction signal commanding correction of wavelength shift caused by a temperature characteristic of the optical filter based on the estimated temperature of the optical filter.

A WDM optical transmission apparatus of the present invention includes:

a plurality of optical transmitters, in which each of the optical transmitters includes:

an optical module that includes a light-emitting device that outputs laser light, a wavelength adjustment unit that adjusts a wavelength of the laser light outputted from the light-emitting device so as to within a predetermined wavelength, a wavelength monitor unit that has the laser light outputted from the light-emitting device pass through an optical filter, receives the laser light having passed therethrough, and monitors the wavelength of the received laser light, a package that accommodates the light-emitting device, the wavelength adjustment unit, and the wavelength monitor unit, and a package temperature detection unit that detects a temperature of the package;

a control unit that stabilizes a light-emission wavelength of the laser light outputted from the light-emitting device to be within the predetermined wavelength range based on a signal outputted from the wavelength monitor unit; and a correction unit that estimates a temperature of the optical filter based on the temperature of the package detected by the package temperature detection unit and outputs, to the control unit, a correction signal commanding correction of wavelength shift caused by a temperature characteristic of the optical filter based on the estimated temperature of the optical filter, in which optical signals outputted from the optical transmitters are wavelength-multiplexed and transmitted.

Another optical transmitter of the present invention includes:

output means for outputting laser light;

monitoring means for monitoring a wavelength of the laser light;

temperature adjustment means for adjusting a temperature of the monitoring means from at least one direction;

detection means for detecting a temperature of the temperature adjustment means;

detection means for detecting a temperature of a package covering the monitoring means; and control means for controlling the wavelength of the laser light based on a signal from the monitoring means, a signal from the detection means for detecting the temperature of the temperature adjustment means, and a signal from the detection means for detecting the temperature of the package.

A method of stabilizing a wavelength of laser light from a light-emitting device, includes: a step that the light-emitting device emits the laser light;

a step of monitoring the wavelength of the laser light outputted from the light-emitting device by receiving the laser light filtered through an optical filter;

a step of correcting a monitored signal based on a temperature of a package accommodating the optical filter; and a step of controlling the wavelength of the laser light from the light-emitting device based on the monitored signal that has been corrected.

DETAILED DESCRIPTION OF THE PREFERRED EMBODIMENTS

Embodiment modes of the present invention will be described below with reference to the drawings, with the embodiments being compared with a conventional technique. A conventional technique of providing the function of a wavelength monitor within an optical module is, for instance, disclosed in JP 2000-56185 A.

Figure 14:
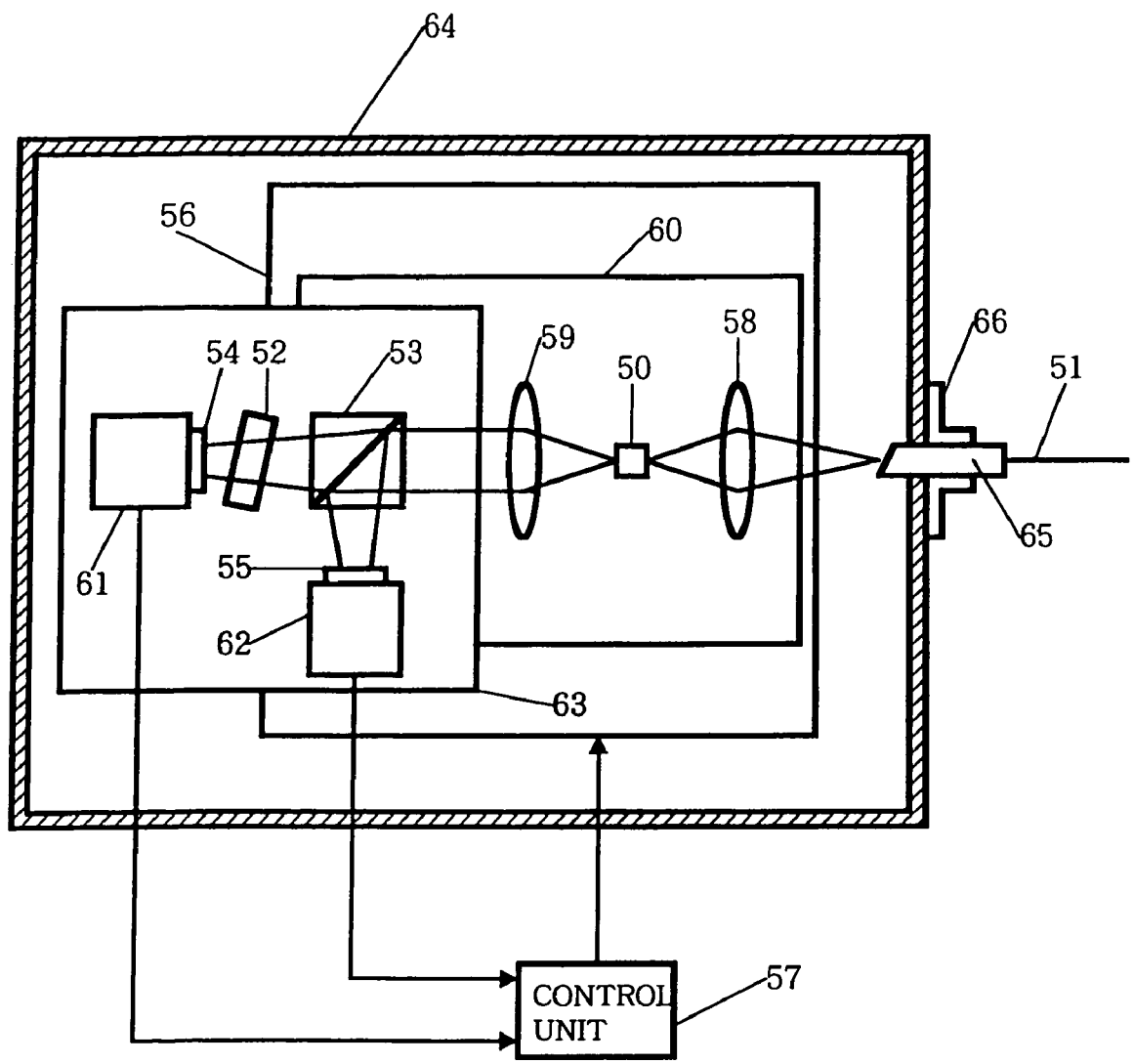
FIG. 14 is an explanatory drawing showing a construction of a conventional optical module.

FIG. 14 is an explanatory drawing showing a construction of a conventional optical module. As shown in FIG. 14, the conventional optical module includes: a light-emitting device 50 that is constructed using a semiconductor laser diode or the like and outputs laser light with a predetermined light-emission wavelength; an optical fiber 51 that is optically coupled to the light-emitting device 50 and sends laser light outputted from a front-side (right-side in FIG. 14) end surface of the light-emitting device 50 to the outside; an optical filter 52 having a cut-off wavelength that is approximately the same as the lasing wavelength of the light-emitting device 50; a beam splitter 53 that is constructed from a half mirror and divides laser light outputted from a back-side (left-side in FIG. 14) end surface of the light-emitting device 50 into two laser lights; a first light-receiving device 54, such as a photodiode, that receives one laser light out of the two laser lights divided by the beam splitter 53 and which has passed through the optical filter 52; a second light-receiving device 55, such as a photodiode, that receives the other laser light out of the two laser lights divided by the beam splitter 53; and a Peltier module 56 that adjusts the temperature of the light-emitting device 50. Also, a control unit 57 is connected to the optical module. This control unit 57 controls the Peltier module 56 so that the wavelength of the light-emitting device 50 is controlled, based on PD currents outputted from the first light-receiving device 54 and the second light-receiving device 55.

Figure 15:
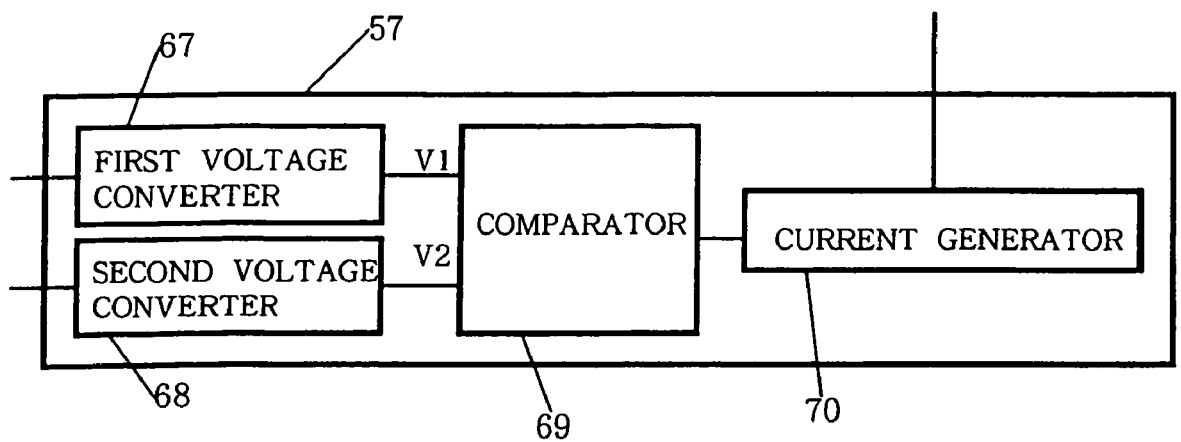
FIG. 15 is a block diagram showing an example of a construction of a control unit.
Figure 16:
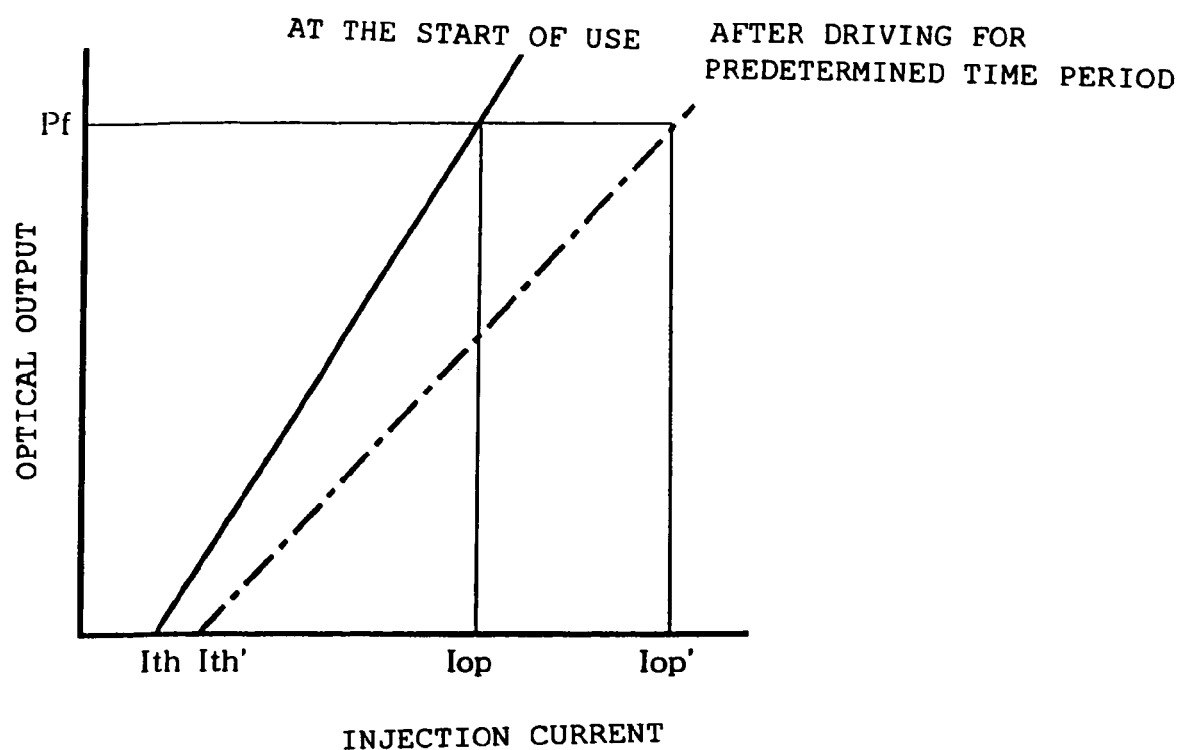
FIG. 16 is a graph illustrating the deterioration with time of a laser diode.

FIG. 15 is a block diagram showing an example of the construction of the control unit 57. As shown in FIG. 16, for instance, the control unit 57 includes: a first voltage converter 67 that converts a first PD current outputted from the first light-receiving device 54 into a first voltage V1; a second voltage converter 68 that converts a second PD current outputted from the second light-receiving device 55 into a second voltage V2; a comparator 69 that outputs a difference or ratio of the first voltage V1 outputted from the first voltage converter 67 and the second voltage V2 outputted from the second voltage converter 68 as a control signal; and a TEC (thermo electric cooler) current generator 70 that outputs a temperature control current for raising or lowering the temperature of the Peltier module 56 based on the control signal outputted from the comparator 69.

Between the light-emitting device 50 and the optical fiber 51, there is arranged a condensing lens 58 that couples the laser light outputted from the front-side end surface of the light-emitting device 50 to the optical fiber 51. Also, between the light-emitting device 50 and the beam splitter 53, there is arranged a collimating lens 59 that converts the laser light outputted from the back-side end surface of the light-emitting device 50 into parallel light.

The light-emitting device 50, the condensing lens 58, and the collimating lens 59 are fixed on an LD carrier 60. The first light-receiving device 54 and the second light-receiving device 55 are fixed on a first PD carrier 61 and a second PD carrier 62, respectively.

The beam splitter 53, the optical filter 52, the first PD carrier 61, and the second PD carrier 62 are fixed on a metallic substrate 63. This metallic substrate 63 is fixed on a surface of the LD carrier 60 and this LD carrier 60 is fixed on the Peltier module 56.

The light-emitting device 50, the beam splitter 53, the optical filter 52, the condensing lens 58, the collimating lens 79, the LD carrier 60, the first PD carrier 61, the second PD carrier 62, the metallic substrate 63, and the Peltier module 56 are provided within a package 64. Also, a ferrule 65 holding a tip portion of the optical fiber 51 is fixed to a side portion of the package 64 through a sleeve 66.

The laser light outputted from the front-side end surface of the light-emitting device 50 is condensed by the condensing lens 58, is incident on the optical fiber 51 held by the ferrule 65, and is sent to the outside.

On the other hand, the laser light outputted from the back-side end surface of the light-emitting device 50 is converted into parallel light by the collimating lens 59 and is divided by the beam splitter 53 in two directions of a Z-axis direction (transmission direction) and an X-axis direction (reflection direction) which is perpendicular to the Z-axis direction. The laser light divided in the Z-axis direction is received by the first light-receiving device 54, while the laser light divided in the X-axis direction is received by the second light-receiving device 55.

The PD currents outputted from the first light-receiving device 54 and the second light-receiving device 55 are inputted into the control unit 57 and the control unit 57 controls the adjustment of the temperature of the Peltier module 56 based on the values of the inputted PD currents, thereby controlling the wavelength of the light-emitting device 50.

Figure 17:
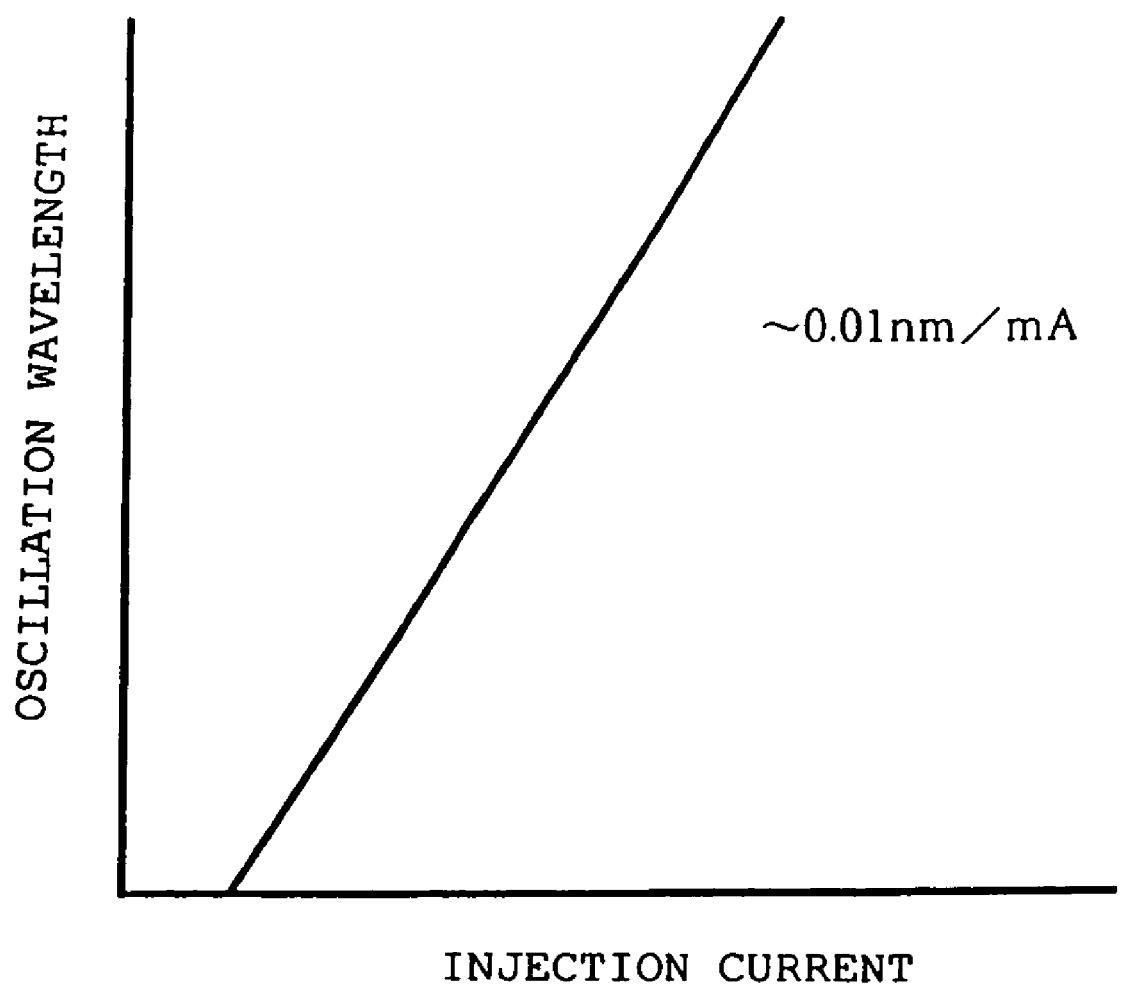
FIG. 17 is a graph showing a relation between an injection current and a light-emission wavelength when the temperature of an LD carrier for the laser diode is fixed.

FIG. 16 is a graph illustrating the deterioration with time of a laser diode. As shown in FIG. 17, at the start of use of an optical module provided with a laser diode, a threshold value thereof is Ith. Also, an APC (Auto Power Control) circuit is driven so that there is obtained a predetermined optical output Pf.

When the use of the optical module is started, an injection current injected into the laser diode in order to obtain the optical output Pf is Iop. The characteristic of the laser diode is deteriorated in accordance with the elongation of the service time of the laser diode and, when the laser diode is used for a predetermined time period, the threshold value is increased from the initial value to Ith'. Also, the injection current injected into the laser diode in order to obtain the optical output Pf is also increased to Iop'.

Also, as shown in FIG. 17, in the case where the temperature of the LD carrier (sub-mount) is fixed, the lasing wavelength of the laser diode has injection current dependency and this dependency is around 0.01 nm/mA under normal conditions. Accordingly, if the deterioration with time of the laser diode occurs in the case where the temperature of the LD carrier is constant, the lasing wavelength is shifted to a long side.

Figure 18:
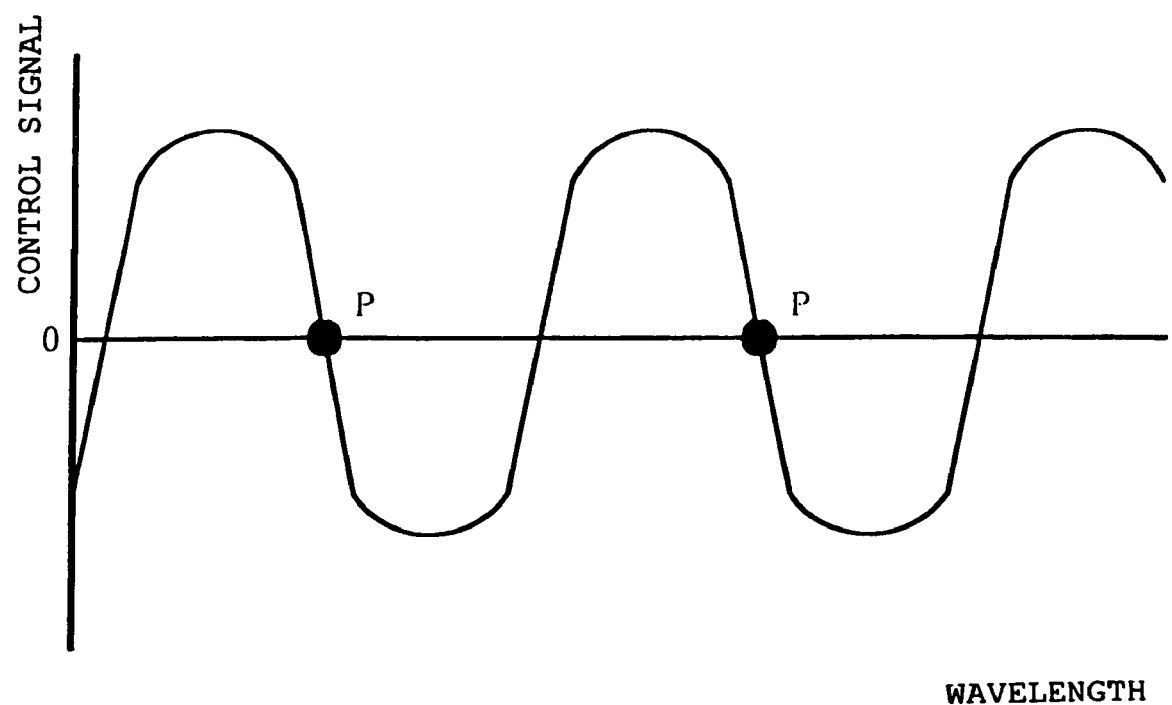
FIG. 18 is a graph showing a relation between the wavelength characteristic and wavelength of an optical filter.

In order to lock the wavelength of a laser diode having such a characteristic, there is used an optical filter. That is, the temperature of the LD carrier, on which the laser diode is mounted, is adjusted using the Peltier module by monitoring the wavelength, and the lasing wavelength of the optical module is fixed at a wavelength lock point P shown in FIG. 18. When the injection current is increased due to the deterioration with time of the laser diode, the temperature of the active layer of the laser diode is increased and the lasing wavelength is shifted to a long wavelength side. However, by driving a wavelength monitor using an optical filter, the wavelength shift is corrected, so that the temperature of the LD carrier is decreased by the Peltier module.

Figure 19:
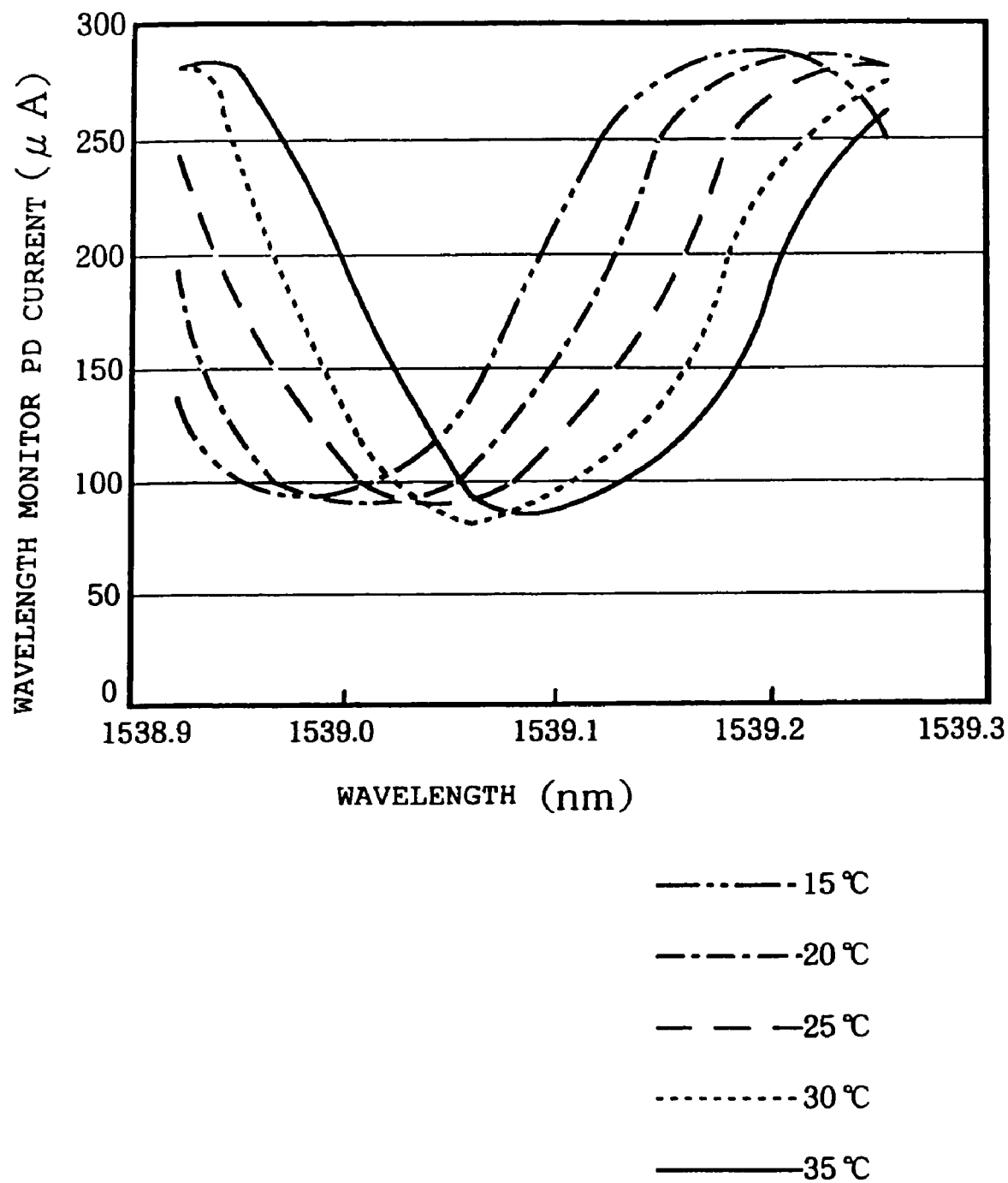
FIG. 19 is a graph showing the temperature characteristic of the optical filter.

Incidentally, the optical filter is, for instance, made of quartz and has temperature dependency (hereinafter simply referred to as the "temperature characteristic") in its light transmission characteristic, as shown in FIG. 19. For instance, the wavelength-light transmittance characteristic of an optical filter is shifted to a short wave side at a ratio of 0.01 nm per degree centigrade.

Figure 20:
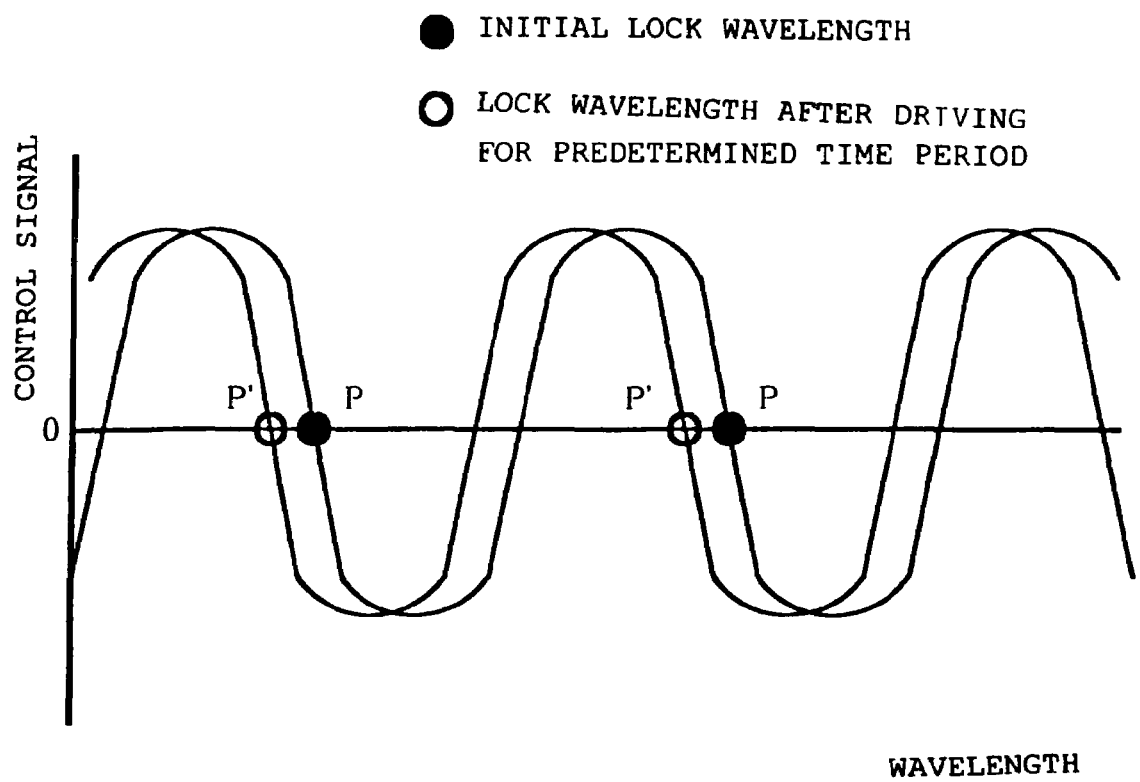
FIG. 20 is a graph illustrating wavelength shift caused by a change of the temperature of the optical filter.
Figure 21:
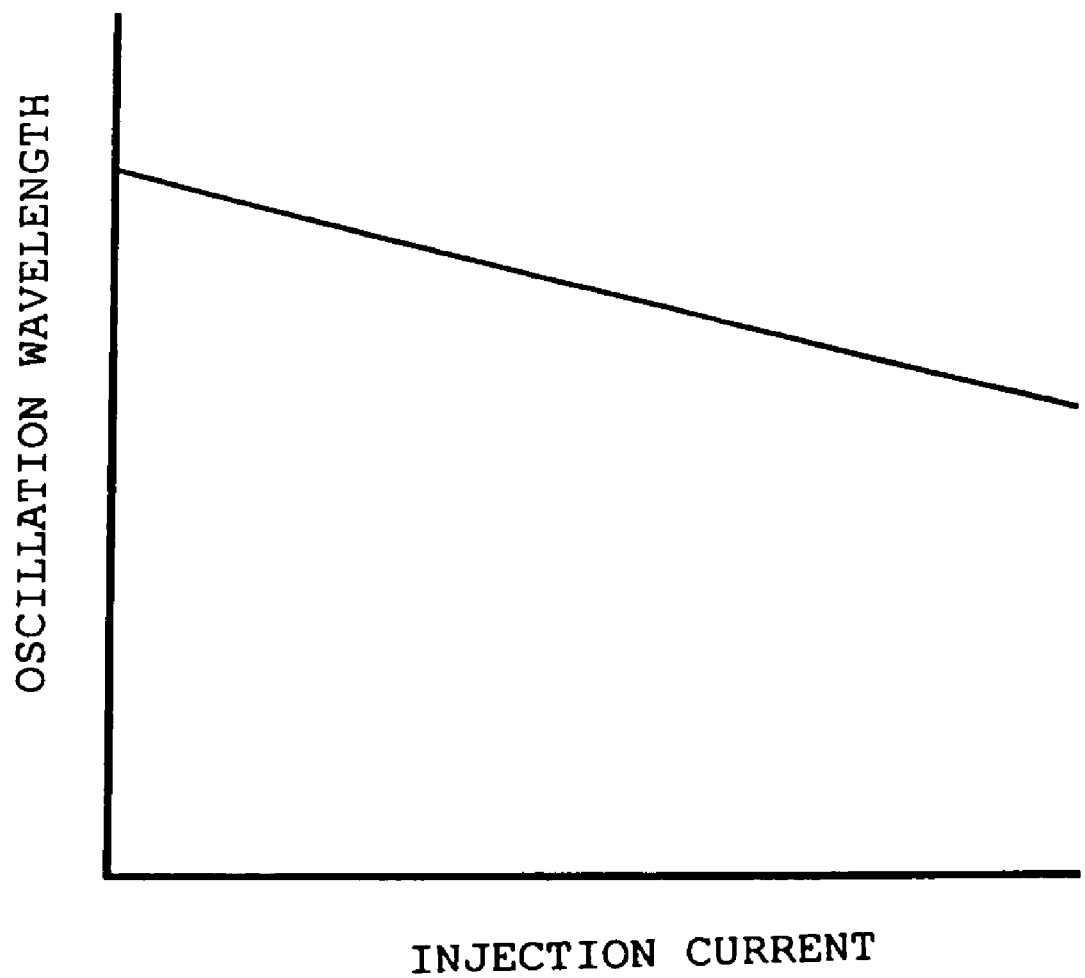
FIG. 21 is a graph showing a relation between an injection current and a wavelength when a wavelength monitor is driven.

In the conventional optical module, as shown in FIG. 14, for instance, the light-emitting device 50 and the optical filter 52 are thermally connected to each other in order to maintain approximately the same temperature. Accordingly, if the temperature of the LD carrier 60, on which the light-emitting device 50 is mounted, is lowered, the temperature of the optical filter 52 is also lowered and there occurs a change of the characteristic of the optical filter 52. That is, when the light-emitting device 50 deteriorates with time because a predetermined time period has passed since the start of driving of the wavelength monitor, the injection current injected into the light-emitting device 50 is increased and the temperature of the light-emitting device 50 is raised. In order to correct wavelength shift due to this phenomenon, the control unit 57 controls the Peltier module 56 so that the temperature of the light-emitting device 50 is lowered and the temperature of the optical filter 52 is lowered accordingly. As a result of the lowering of the temperature of the optical filter, it becomes impossible to obtain the initial wavelength characteristic and the optical filter characteristic is shifted to the short wave side as a whole, as shown in FIG. 20. In FIG. 20, a mark "●" represents the initial lock wavelength P and a mark "○" represents the lock wavelength P' after the driving for the predetermined time period. As described above, the lock wavelength is shifted from P to P' and it becomes impossible to obtain light having a desired wavelength. In the case where the wavelength monitor is driven, there exists a relation shown in FIG. 21 between the injection current and the wavelength, which means that the lasing wavelength has current dependency.

Figure 22:
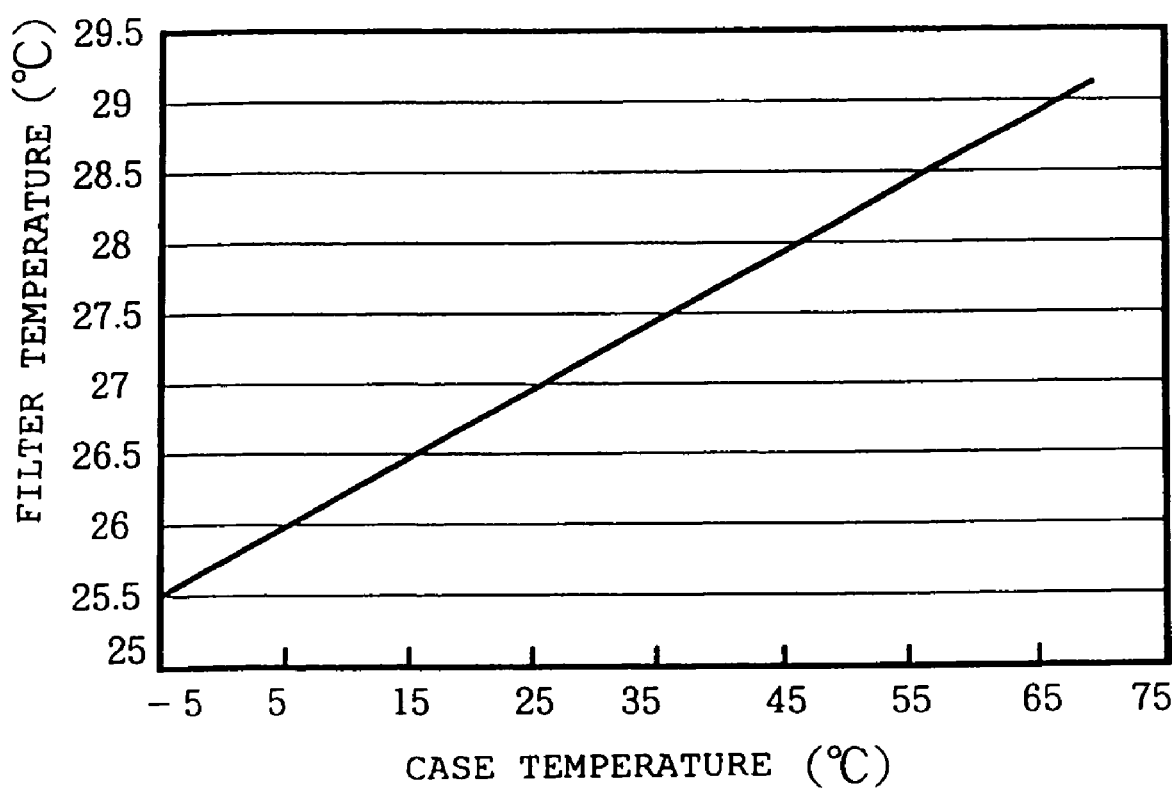
FIG. 22 is a graph showing a relation between a case temperature (package temperature) and a filter temperature.

Also, even in the case where the Peltier module 56, in which the optical filter is mounted, is controlled to have a fixed temperature, the temperature within the optical module fluctuates in accordance with changes in the external environmental temperature and in the amount of power consumed by the optical module. Consequently, there is exerted an influence of a fluctuation of the environmental temperature from a side of the optical filter that does not directly contact the Peltier module. As a result, the temperature of the optical filter fluctuates in the manner shown in FIG. 22, for instance.

Wavelength shift caused by such a change of the temperature of the optical filter becomes a cause of the degradation of a signal due to crosstalk and therefore is not preferable for a dense WMD system in which there is required to stabilize a wavelength.

Figure 23:
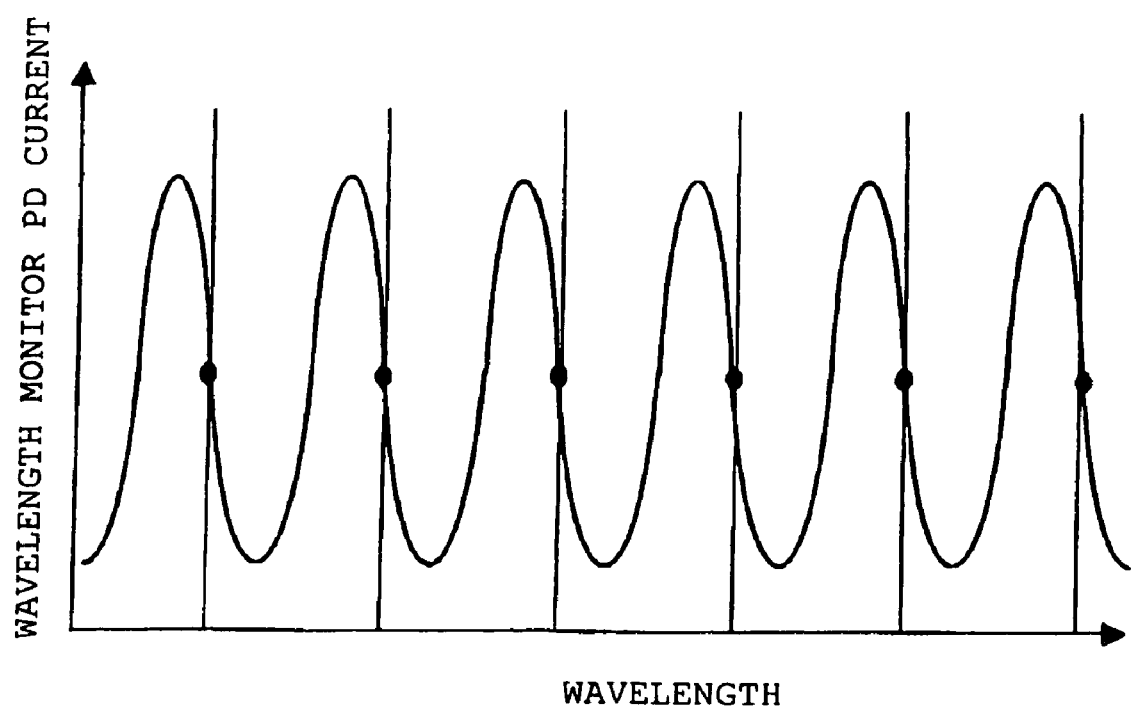
FIG. 23 is a graph showing the wavelength discrimination characteristic of the optical filter (etalon filter)

Also, in the dense WMD system, the wavelength spacing between optical signals are narrow, so that it is stringently demanded to prevent wavelength shift at each optical signal wavelength and it is required to fix a light-emission wavelength with high precision. For instance, in the case where optical signals are arranged using an etalon filter having a wavelength discrimination characteristic shown in FIG. 23 as an optical filter, in order to make it possible to arrange the optical signals at constant wavelength spacing, the etalon filter is formed so that the center portion of each slope overlaps a predetermined wavelength.

Incidentally, in JP 2001-44558 A, for instance, there is proposed a technique with which the temperature of an etalon is detected, a correction signal is sent to a control unit by a correction unit, and there is performed temperature correction. In general, the etalon filter has a temperature characteristic. Among materials used for the etalon, crystal has a small temperature characteristic and is used with the technique disclosed in the document described above. Here, it is known that the temperature characteristic of a crystal etalon is 5 pm per degree centigrade.

It has conventionally been required that it is guaranteed that the case temperature of a package applied to an optical module remains within a range of 5 to 70 degrees centigrade. Accordingly, a drift degree becomes "5 pm per degree centigrade×75 degrees centigrade=375 pm" due to the temperature of the etalon.

Also, in the case where the adjustment temperature of a temperature adjustment device, on which the optical filter is mounted, fluctuates, the drift degree due to the fluctuation of the temperature of the etalon is further increased.

Figure 24:
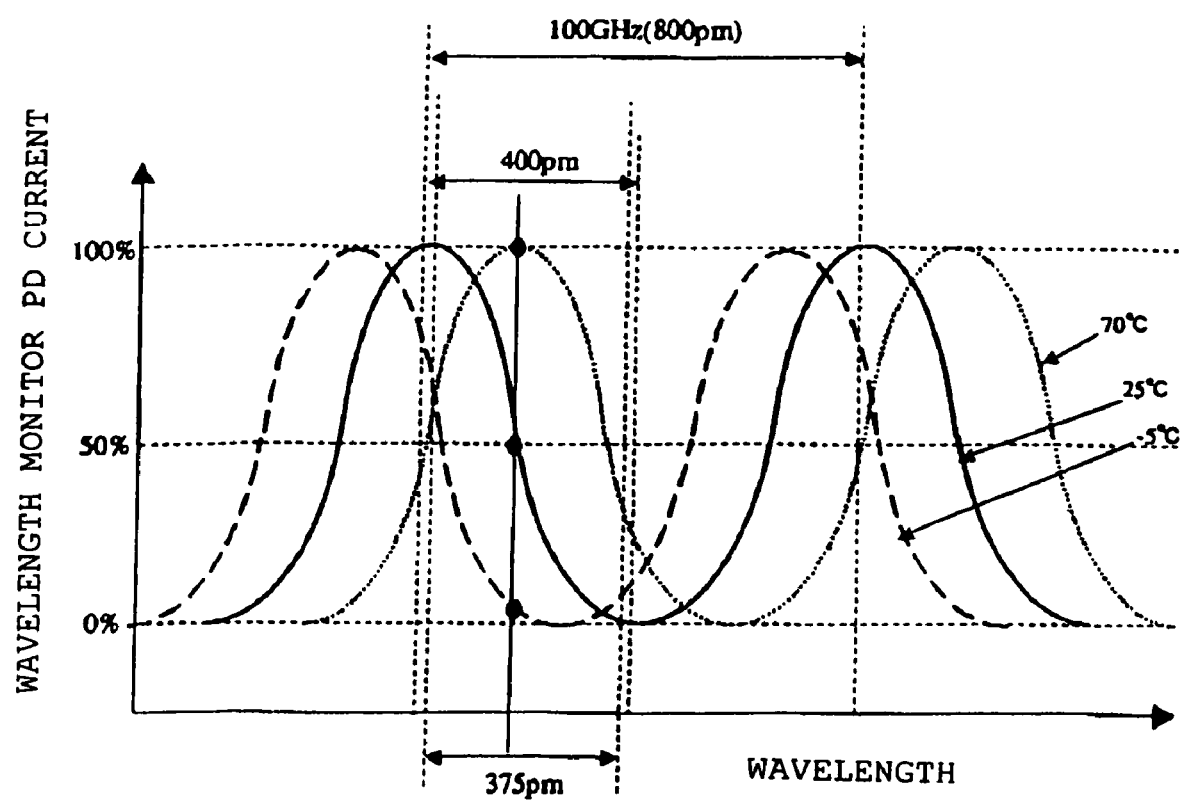
FIG. 24 is a graph showing a relation between a wavelength and a wavelength monitor PD current for illustrating problems of a conventional technique.

If the wavelength locking is performed using a crystal etalon with intervals of 100 GHz (800 pm) and there is performed temperature compensation as shown in FIG. 24, for instance, the locked wavelength and the locking point on a slope are expressed as a relation shown in the drawing. By performing the temperature compensation, the locked wavelength and the locking point on the slope actively move on the slope.

On the other hand, in the field of WMD, in particular, in the field of dense WMD, there is required a very large number of laser modules having light-emission wavelengths that differ from each other. However, it is not realistic to produce a laser having wavelengths of all of these kinds using different specifications, and it is preferable that one laser module is formed so as to be adjustable to several required wavelengths and to have a characteristic with which it is possible to cope with at least two wavelengths. In order to realize such wavelength adjustment, it is effective that the optical filter used in the wavelength monitor unit is made of an etalon or the like whose wavelength transmission characteristic has repetition periods for the required wavelength of laser light.

It is impossible, however, to distinguish a wavelength, in proximity to which the lasing wavelength of a laser exists, of the repetition periods of the wavelength transmission characteristic of the optical filter using a signal from a wavelength monitor.

Accordingly, it is required to control beforehand a laser light-emission wavelength to fall within a certain wavelength range in which it is possible to perform adjustment using the wavelength monitor. In order to perform the lasing wavelength control through the control of a temperature adjustment device, on which the light-emitting device is mounted, it is required to measure and control the temperature of the light-emitting device with precision. Consequently, it is required to arrange a temperature detection unit in proximity to the light-emitting device.

Assuming that a lock point exists at the center of a slope if the temperature of an etalon is 32.5 degrees centigrade that is the intermediate temperature, the lock point exists at a position, at which the inclination of the slope is eased in the lower portion of the slope, if the temperature of the etalon becomes −5 degrees centigrade, and the lock point exists at a position, at which there is obtained the maximum value of the light-receiving device, if the temperature becomes −70 degrees centigrade. The wavelength locking is performed to detect to which side the wavelength drifts using the slope. Accordingly, on the low temperature side and the high temperature side described here, sufficient locking becomes impossible and, in particular, the wavelength shifts to a neighboring slope by exceeding the peek of the wavelength discrimination characteristic. Accordingly, it becomes impossible to perform the wavelength locking by performing temperature compensation for an etalon filter with short periods that is used in a dense WMD system like this. Needless to say, if the wavelength spacing is narrowed from 50 GHz, through 25 GHz, to 12.5 GHz in order to improve a transmission capacity, a range, in which it is possible to perform the locking, becomes apparently narrower than a range of 345 pm, in which it is possible to perform temperature compensation. Consequently, it becomes impossible to perform the wavelength locking.

As described above, in the dense WMD system with narrow wavelength spacing, it is required to suppress wavelength shift to a level of several pm or lower and it has been impossible to meet such a demand with a conventional optical module or optical transmitter where there occurs wavelength shift of at least 10 pm due to only the dependency on a case temperature.

Also, the temperature of the optical module is controlled only from the bottom surface side, so that there occurs temperature distribution for each component. In particular, the transmission wavelength characteristic of the etalon filter is determined by the filter length in the optical-axis direction and there is required an incident area equal to or greater than the optical diameter of incident light. This means that it is required that the etalon filter has a size that is at least equal to 1 mm.

Also, the etalon filter has a small heat conductivity in comparison with a metal and, in the case of an etalon filter using crystal, the heat conductivity in the optical-axis direction becomes 0.0255 Cal/cm·sec·deg, although the heat conductivity in a direction vertical to the optical axis (that is, in a direction vertical to the adjustment surface of the temperature adjustment device) is as low as 0.0148 Cal/cm·sec·deg and therefore it is difficult to control the temperature adjustment device and there tends to occur temperature distribution in comparison with another component such as the light-emitting device.

In view of these problems, the inventor of the present invention has devised a technique with which a light-emission wavelength is stabilized by additionally providing a temperature detection unit for detecting the temperature of an optical filter separately from a temperature detection unit that detects the temperature of a light-emitting device and by correcting wavelength shift caused by the temperature characteristic of the optical filter. However, the temperature change to be detected of the optical filter is extremely small. Thus, even if the temperature detection unit is provided in the vicinity of the optical filter, it is difficult to perform measurement with precision. There is also a problem in that the temperature detection unit itself involves variation.

To circumvent this problem, in the embodiments of the present invention, by utilizing a fact that a correlation exists between the package temperature and the temperature characteristic of the optical filter, there are provided a laser light wavelength stabilizing method and an optical module, an optical transmitter, and a WMD optical transmission apparatus of controlling a wavelength of a semiconductor laser, which are each capable of stabilizing the lasing wavelength of laser light with high precision by estimating the temperature of an optical filter using a detected temperature of the light-emitting device and by correcting wavelength shift caused by the temperature characteristic of the optical filter based on the estimated temperature of the optical filter.

Figure 1:
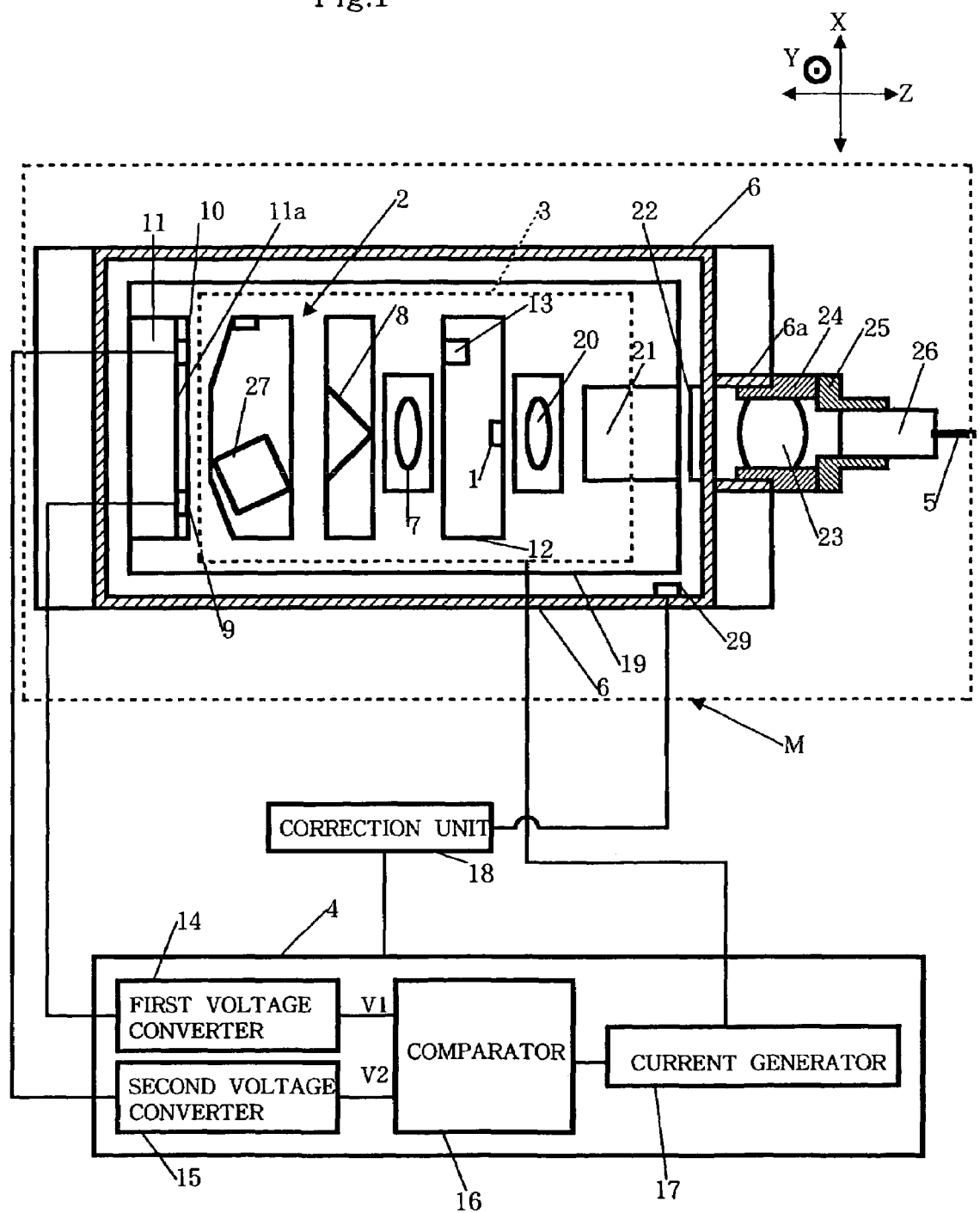
FIG. 1 is a plan cross-sectional view illustrating an optical transmitter according to a first embodiment of the present invention.

Hereinafter, embodiments of the present invention will be described with reference to the drawings. FIG. 1 is a plan cross-sectional view illustrating an optical transmitter according to a first embodiment of the present invention, while FIG. 2 is a side cross-sectional view thereof.

Figure 2:
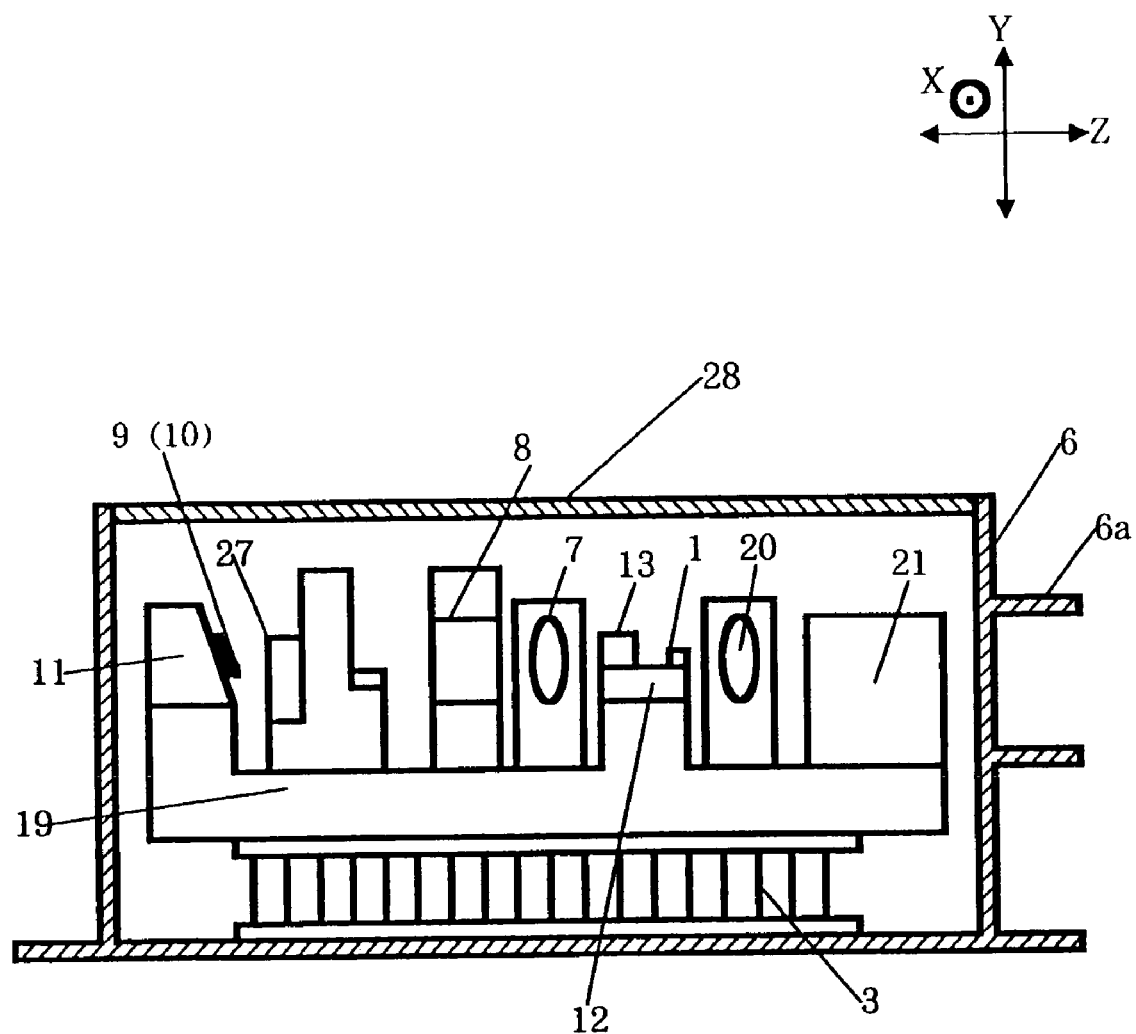
FIG. 2 is a side cross-sectional view illustrating the optical transmitter according to the first embodiment of the present invention.

As shown in FIGS. 1 and 2, the optical transmitter according to the first embodiment of the present invention includes: a light-emitting device 1, such as a semiconductor laser diode, that outputs laser light; a wavelength monitor unit 2 that receives laser light for monitoring outputted from the back-side (left-side in FIG. 1) end surface among laser light outputted from the light-emitting device 1; a temperature adjustment unit 3, such as a thermo module, that controls the temperature of the light-emitting device 1; a control unit 4 that controls the adjustment temperature of the temperature adjustment unit 3 so that the lasing wavelength of laser light emitted from the light-emitting device 1 is fixed at a predetermined wavelength, based on a signal outputted from the wavelength monitor unit 2; an optical fiber 5 that is struck by laser light outputted from the front-side (right-side in FIG. 1) end surface of the light-emitting device 1 and sends the laser light to the outside; and a package 6 that hermetically seals the inside.

Here, an optical module M includes the light-emitting device 1, the wavelength monitor unit 2, the temperature adjustment unit 3, and the optical fiber 5, which corresponds to a portion surrounded by the dotted line in FIG. 1 that.

Figure 3:
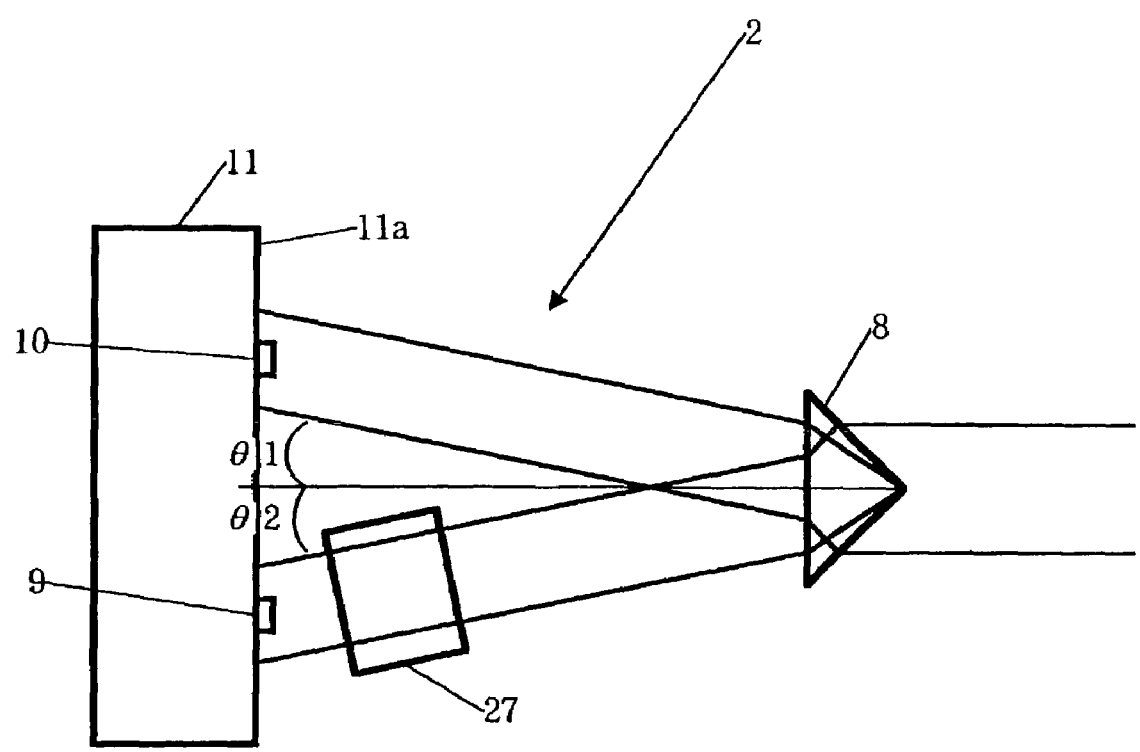
FIG. 3 is an explanatory drawing showing a construction of a wavelength monitor unit.

The wavelength monitor unit 2 is arranged within the package 6 that hermetically seals the light-emitting device 1. FIG. 3 is an explanatory drawing showing the construction of the wavelength monitor unit 2. As shown in FIG. 3, the wavelength monitor unit 2 includes: a prism 8 that divides laser light, which was outputted from the back-side end surface of the light-emitting device 1 and was converted into parallel light by a collimating lens 7, into two laser lights; a first light-receiving device 9, such as a photodiode, that receives one of the two laser lights divided by the prism 8; a second light-receiving device 10, such as a photodiode, that receives the other of the two laser lights divided by the prism 8; and an optical filter 27 that is arranged between the prism 8 and the first light-receiving device 9. The first light-receiving device 9 and the second light-receiving device 10 are fixed on the same plane (on the same attaching surface 11a, in this embodiment) of a PD carrier 11.

The entire surface of the prism 8 is coated with an AR (Anti-Reflection) film in order to suppress the reflection of laser light. It is preferable that the inclination angles θ1 and θ2 of laser light divided by the prism 8 are approximately the same angle (in a range of from 15° to 45°, for instance). This is because it becomes easy to determine the light-receiving positions of the first light-receiving device 9 and the second light-receiving device 10.

The optical filter 27 has periodicity in its wavelength-transmission light intensity characteristic and there is, for instance, used a Fabry-Perot etalon, a dielectric multi-layered film filter, or the like whose wavelength spacing between respective periods is 100 GHz or shorter.

The light-emitting device 1 is fixed on an LD carrier 12. On the LD carrier 12, there is also provided a temperature detection unit 13, such as a thermistor, that detects the temperature of the light-emitting device 1.

Also, the LD carrier 12 and the wavelength monitor unit 2 are fixed on a base 19. Accordingly, the light-emitting device 1 and the optical filter 27 are thermally connected to each other and the temperature of the optical filter 27 is changed in accordance with a change of the temperature of the light-emitting device 1 by the temperature adjustment unit 3.

The control unit 4 controls the temperature detected by the temperature detection unit 13 using the temperature adjustment unit 3 based on a voltage difference or voltage ratio between two inputted PD currents so that the wavelength of light emitted from the light-emitting device 1 becomes constant.

The control unit 4 includes: a first voltage converter 14 that converts a first PD current outputted from the first light-receiving device 9 into a first voltage V1; a second voltage converter 15 that converts a second PD current outputted from the second light-receiving device 10 into a second voltage V2; an operator (comparator) 16 that outputs a voltage difference or voltage ratio between the first voltage V1 outputted from the first voltage converter 14 and the second voltage V2 outputted from the second voltage converter 15 as a control signal; and a current generator 17 that outputs a temperature control current for controlling the adjustment temperature of the temperature adjustment unit 3 in accordance with the control signal outputted from the comparator 16. Note that an amplifier (not shown) that amplifies the first voltage V1 outputted from the first voltage converter 14 and the second voltage V2 outputted from the second voltage converter 15 may be provided so as to precede the comparator 16.

A package temperature detection unit 29 for detecting the package temperature is disposed inside the package 6.

Also, the package temperature detection unit 29 is connected to a correction unit 18. This correction unit 18 estimates the temperature of the optical filter 27 based on the temperature detected by the light-emitting device temperature detection unit 13 and the package temperature detected by the package temperature detection unit 29 and outputs, to the comparator 16 of the control unit 4, a correction signal that commands the correction of wavelength shift caused by the temperature characteristic of the optical filter 27 based on the estimated temperature of the optical filter 27.

Here, there will be described a correlation between the package temperature and the temperature of the optical filter 27 and the estimation of the temperature of the optical filter.

Figure 4:
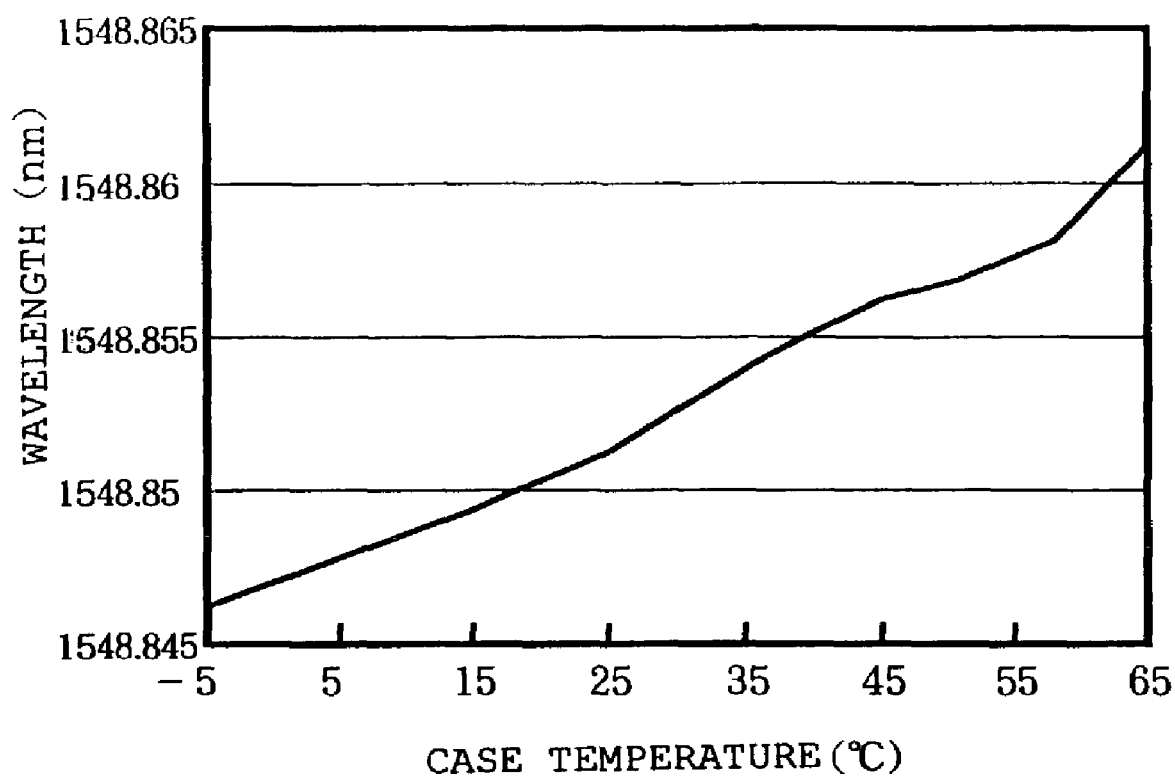
FIG. 4 is a graph showing a relation between the wavelength and temperature of the wavelength monitor unit.
Figure 5:
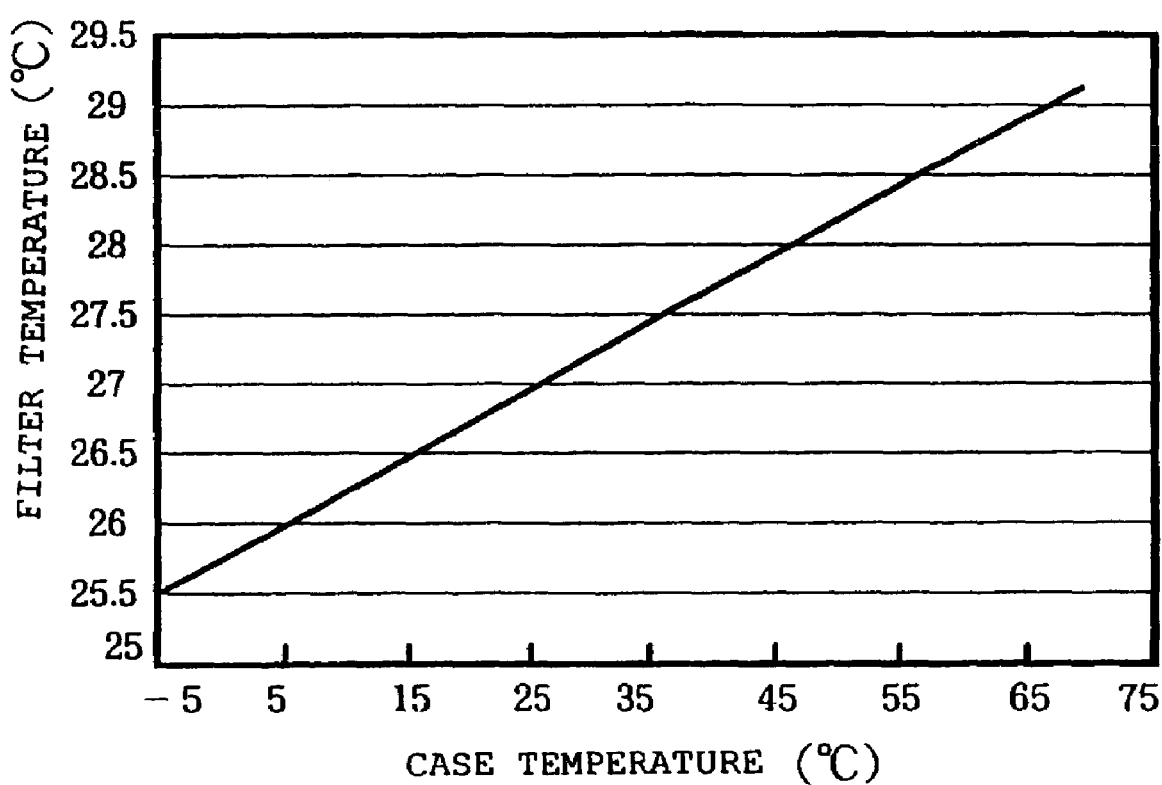
FIG. 5 is a graph showing a relation between a case temperature (package temperature) and a filter temperature.

As shown in FIG. 4, when the lasing wavelength is locked based on a signal from the wavelength monitor unit 2, the wavelength has case temperature dependency because heat is conducted to the optical filter 27 through the heat radiation from the package 6. Also, a correlation exists between the case temperature and the optical filter as shown in FIG. 5 and the temperature of the optical filter is proportional to the case temperature.

Figure 6:
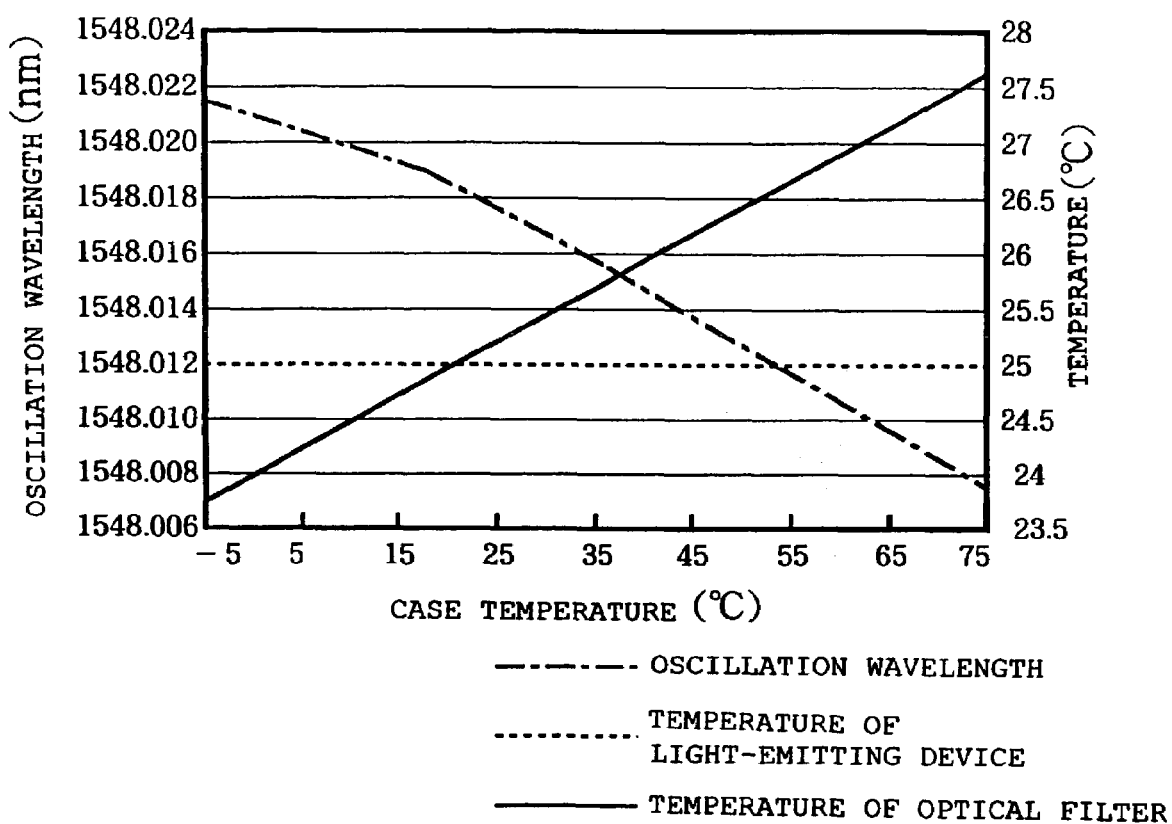
FIG. 6 is a graph showing a relation between a case temperature (package temperature), a light-emission wavelength of laser light, a temperature of a light-emitting device, and a filter temperature in a case where control of a temperature control unit is performed so that a temperature of the light-emitting device is kept constant (ATC driving)

FIG. 6 is a graph showing relations among the case temperature (package temperature), the lasing wavelength of laser light, the temperature of the light-emitting device 1, and the temperature of the optical filter 27 in the case where the temperature adjustment unit 3 is controlled so that the temperature of the light-emitting device 1 is fixed (in the case where ATC driving is performed).

Under a state where the temperature of the light-emitting device 1 is kept constant, the lasing wavelength of laser light outputted from the light-emitting device 1 varies in accordance with the changing of the package temperature. In more detail, the lasing wavelength drifts to the short side in accordance with the rising of the package temperature. This phenomenon will be described below.

That is, heat flowing to the thermistor of the light-emitting device 1 is increased in accordance with the rising of the package temperature. Control is performed so that the temperature of the thermistor becomes constant during the ATC driving. Therefore, when the flowing heat is increased, it is increasingly attempted to cool the thermistor, which means that it is increasingly attempted to cool the temperature adjustment unit 3. Therefore, the actual temperature of the light-emitting device 1 is lowered, so that the lasing wavelength is shifted to the short wavelength side. The temperature of the optical filter 27 is increased in proportion to the increasing of the package temperature due to the heat flowing inside of the package 6.

Also, as can be seen from FIG. 6, the changing degree of the package temperature is greater than the changing degree of the temperature of the optical filter 27 itself, which means that it is possible to measure subtle changes of the package temperature. Consequently, it is possible to perform temperature compensation for the optical filter 27.

Figure 7:
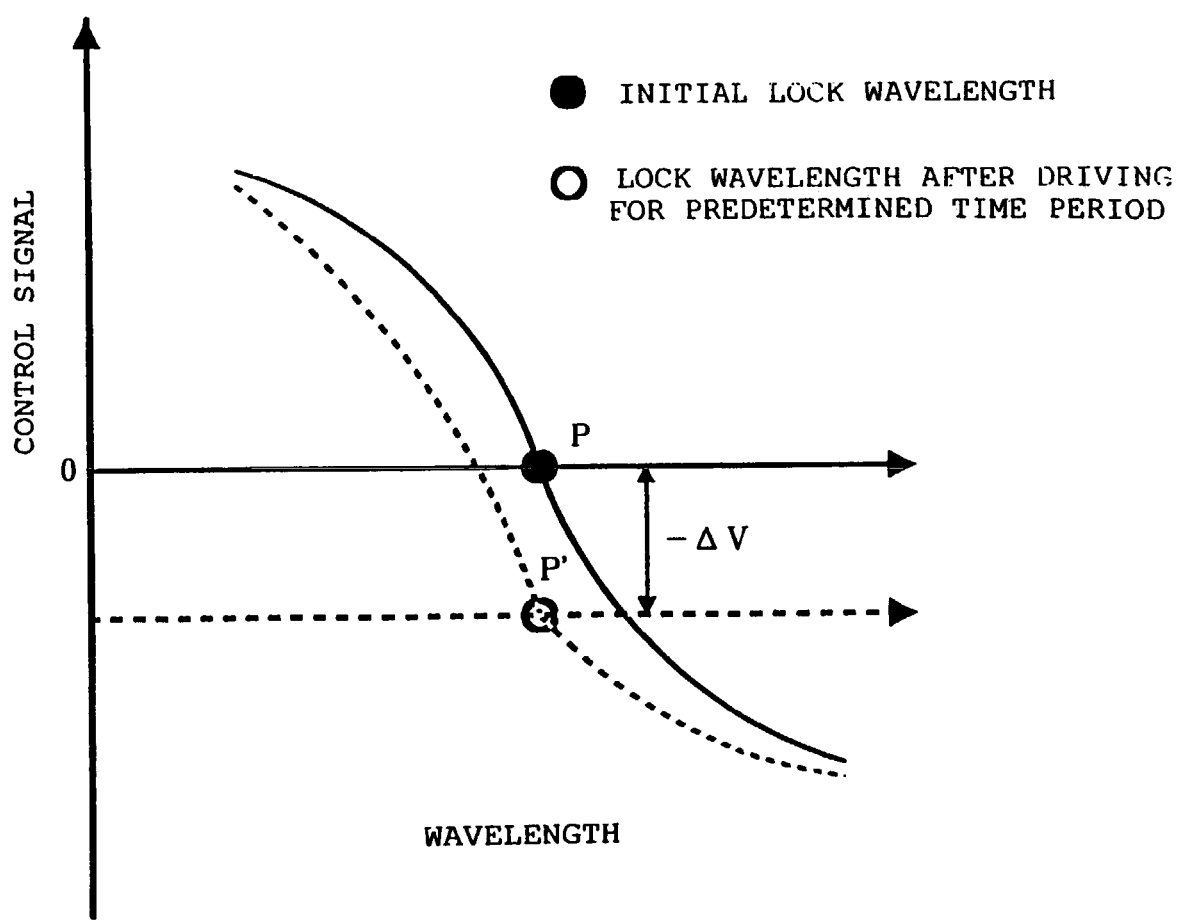
FIG. 7 is a graph illustrating a method of correcting wavelength shift.

The correction unit 18 corrects wavelength shift due to the temperature characteristic of the optical filter 27 by inputting a predetermined voltage corresponding to the temperature of the optical filter 27 into the comparator 16 of the control unit 4 and by offsetting the voltage of a control signal by a degree corresponding to the inputted voltage. For instance, as shown in FIG. 7, after driving is performed for a predetermined time period from an initial state, the wavelength characteristic is shifted to the short wavelength side due to the temperature characteristic of the optical filter 27. In order to maintain an initial wavelength, first, there is obtained the temperature characteristic of the optical filter 27 in advance. The correction unit 18 estimates the temperature of the optical filter 27 based on the temperature of the light-emitting device 1 detected by the temperature detection unit 13, outputs an appropriate correction voltage in accordance with a change of the estimated temperature of the optical filter, and performs feedback to the comparator 16 of the control unit 4. The point of "0 V" of the control voltage signal is offset by a correction voltage. In FIG. 7, when the wavelength characteristic is shifted from the 0 V point under the initial state due to a change of the temperature of the optical filter 27 after the driving for a predetermined time period, this temperature change is detected and there is outputted a voltage Δ V corresponding to the degree of the temperature change. By doing so, a point, which is lowered from the 0 V point under the initial state by Δ V, returns to a 0 V point. The wavelength is locked at the 0 V point in this manner, so that it becomes possible to perform the wavelength locking with stability without generating any change from the wavelength under the initial state.

The voltage value applied to the offset may be preset by measuring optimum voltage values for two temperatures and by performing linear calculation based on the voltage values or may be read from a database in which there is stored an optimum offset voltage value for each temperature.

On the front side (right-side in FIG. 1) of the light-emitting device 1, there is provided a collimating lens 20 that converts laser light outputted from the front-side end surface thereof into parallel light. Also, on the front side of the collimating lens 20, there is provided an optical isolator 21 that cuts off light returning to the light-emitting device 1. This optical isolator 21 is a well-known optical isolator that is constructed, for instance, by combining a polarizer with a Faraday rotator.

Within a flange portion 6a formed in a side portion of the package 6, there are provided a window portion 22, on which light having passed through the optical isolator 21 is incident, and a condensing lens (second lens) 23 that condenses laser light on an end surface of the optical fiber 5. The condensing lens 23 is held by a lens holder 24 fixed to an end portion of the flange portion 6a by YAG laser welding and a metallic slide ring 25 is fixed to an end portion of the lens holder 24 by YAG laser welding.

The optical fiber 5 is held by a ferrule 26 and this ferrule 26 is fixed inside the slide ring 25 by YAG laser welding.

A lid portion 28 (see FIG. 2) is put on the upper portion of the package 1 and the outer edge thereof is subjected to resistance welding, thereby hermetically sealing the inside of the package 6.

Laser light outputted from the front-side end surface of the light-emitting device 1 is converted into parallel light by the collimating lens 20, is condensed by the condensing lens 23 through the optical isolator 21 and the window portion 22, is incident on the optical fiber 5, and is sent to the outside.

On the other hand, laser light outputted from a back-side end surface of the light-emitting device 1 is converted into parallel light by the collimating lens 7 and is divided in two directions by the prism 8. One of the divided laser light is received by the first light-receiving device 9 through the optical filter 27, while the other of the divided laser light is received by the second light-receiving device 10. The first PD current and the second PD current outputted from the first light-receiving device 9 and the second light-receiving device 10 are inputted into the control unit 4.

The control unit 4 converts the first PD current into a first voltage V1 using the first voltage converter 14, converts the second PD current into a second voltage V2 using the second voltage converter 15, and outputs a voltage difference or voltage ratio between the first voltage V1 and the second voltage V2 as a control signal using the comparator 16. The control signal outputted from the comparator 16 is inputted into the current generator 17. This current generator 17 selectively outputs a temperature control current for raising or lowering the temperature of the temperature adjustment unit 3 based on the control signal from the comparator 16. By doing so, it becomes possible to perform control so that the lasing wavelength of laser light outputted from the light-emitting device 1 becomes a desired wavelength.

Also, the correction unit 18 estimates the temperature of the optical filter 27 based on the temperature of the light-emitting device 1 detected by the package temperature detection unit 29, and outputs, to the control unit 4, a correction signal commanding the correction of wavelength shift caused by the temperature characteristic of the optical filter 27 based on the estimated temperature of the optical filter 27. Accordingly, it becomes possible to stabilize the lasing wavelength of laser light with precision. As a result, it becomes possible to provide an optical module and an optical transmitter that are capable of reducing the signal degradation of an optical signal and are high in reliability.

It should be noted here that in order to drive the wavelength locking, it is required that the lasing wavelength of the light-emitting device 1 falls within a predetermined range of a wavelength discrimination curve.

Figure 8:
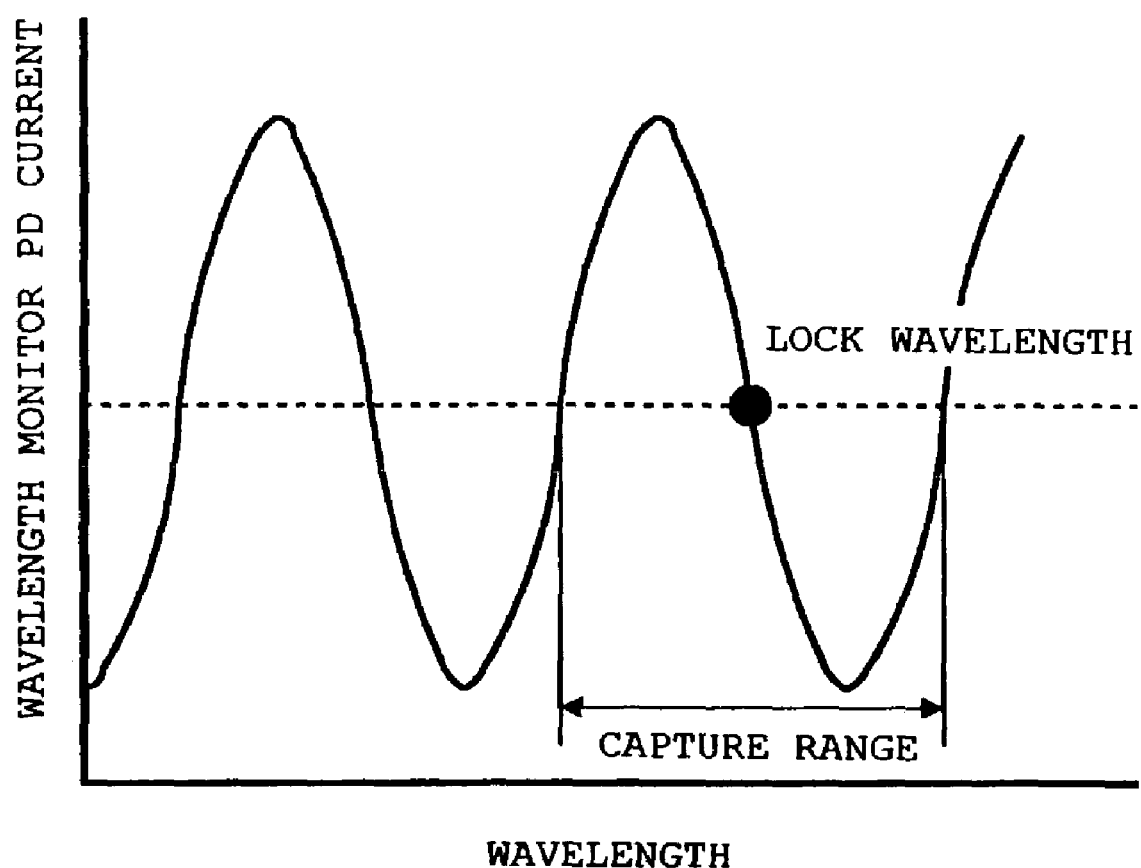
FIG. 8 is a graph showing a wavelength discrimination curve.

FIG. 8 is a graph showing the wavelength discrimination curve. In FIG. 8, the black plot on the wavelength discrimination curve represents a wavelength at which the locking is performed. In order to drive this wavelength locking, it is required that the wavelength exists within the illustrated capture range prior to the wavelength locking driving. To do so, it is required to perform ATC driving that controls the temperature adjustment unit 3 constructed using a Peltier module by detecting the temperature of the light-emitting device 1. To do so, it is required to use the temperature detection unit 13 that detects the temperature of the light-emitting device 1.

Next, there will be described a procedure for controlling the wavelength locking. First, a current is injected into the light-emitting device 1 by an ACC circuit or an APC circuit, the temperature of the light-emitting device 1 is detected by the temperature detection unit 13, and temperature control is performed by controlling the temperature adjustment unit 3 using the ATC circuit. The ATC circuit compares the detected temperature with a reference temperature and performs control so that a difference therebetween becomes zero. Accordingly, it becomes possible to control a light-emission wavelength by controlling the reference temperature. The lasing wavelength is adjusted so as to be within the capture range shown in FIG. 8 by controlling the reference temperature. After it is confirmed that the lasing wavelength falls within the capture range, there is performed switching to the wavelength locking, and temperature control is performed by the temperature adjustment unit 3 in accordance with a wavelength monitor signal in the manner described above.

By following this procedure for controlling the wavelength locking, the lasing wavelength is stabilized at the plotted locking point.

According to the first embodiment of the present invention, by utilizing a fact that a correlation exists between the package temperature and the temperature characteristic of the optical filter 27, the temperature of the optical filter 27 is estimated by detecting the package temperature and wavelength shift caused by the temperature characteristic of the optical filter 27 is corrected based on the estimated temperature of the optical filter 27. Accordingly, it becomes possible to stabilize the lasing wavelength of laser light with high precision for a long time period. As a result, it becomes possible to improve the reliability of the system.

Further, it is not required to separately provide a temperature detection unit that detects the temperature of the optical filter 27, so that there is not increased the number of components and the number of wiring. As a result, it becomes possible to simplify the construction of the optical module and to realize the reduction in cost.

Figure 9:
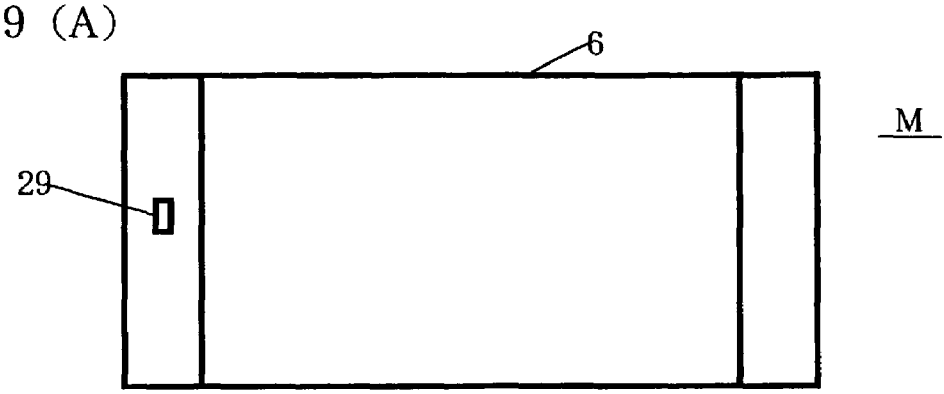
FIG. 9A is a plan view showing a second embodiment of the present invention.
FIG. 9B is a side view of FIG. 9A.
FIG. 9C is a plan view showing a third embodiment of the present invention.
FIG. 9D is a side view of FIG. 9C.
Figure 9:
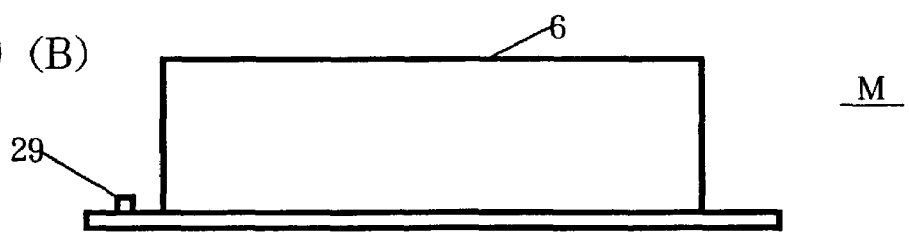
Figure 9:
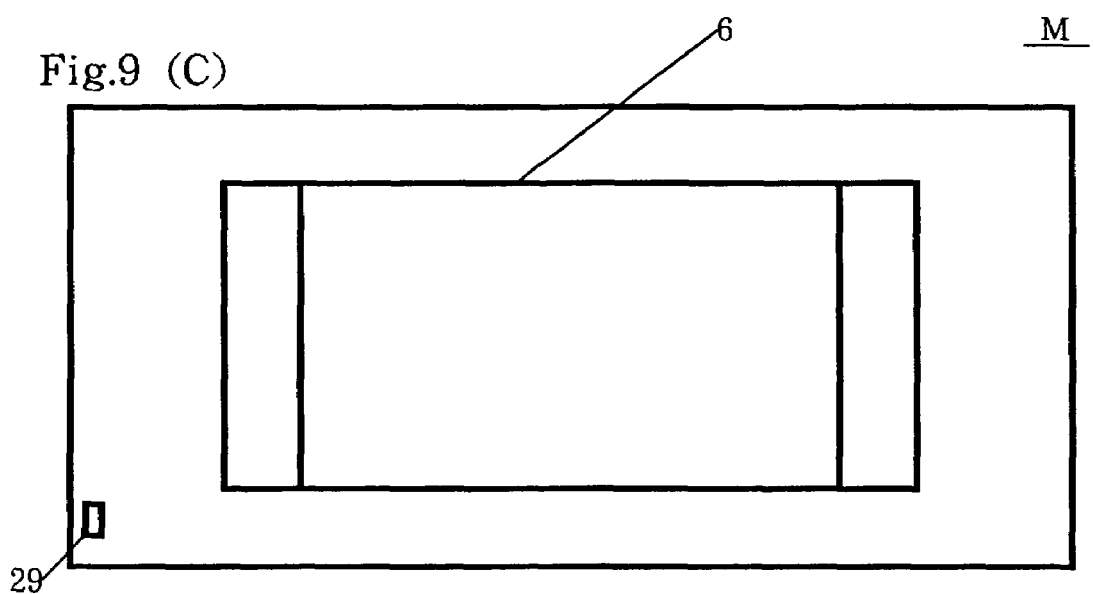
Figure 9:
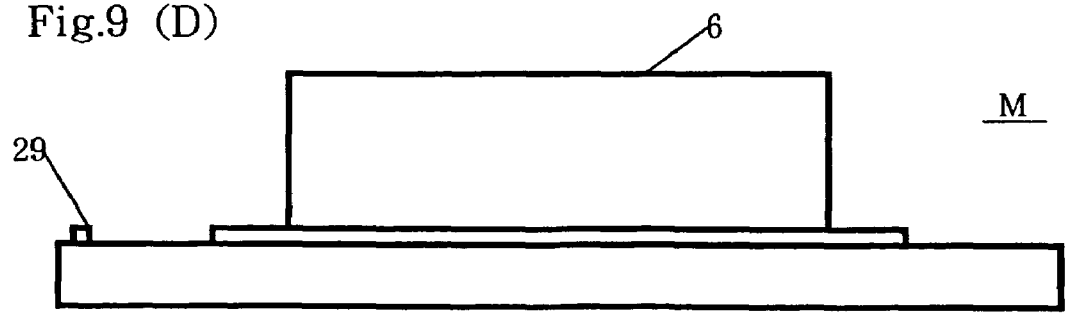

FIGS. 9A and 9B are each a plan view and a side view illustrating a second embodiment of the present invention. As shown in FIGS. 9A and 9B, a package temperature detection unit 29 is arranged outside of a package 6 in this second embodiment.

FIGS. 9C and 9D are each a plan view and a side view illustrating a third embodiment of the present invention. As shown in FIGS. 9C and 9D, a package temperature detection unit 29 is arranged in proximity to a package 6 in this third embodiment.

In the second and third embodiments, the package temperature detection unit 29 is not arranged inside of the package 6 but is arranged outside of the package 6, so that it is possible to change the position of the package temperature detection unit 29 to a desired position even after the inside of the package 6 is sealed.

Figure 10:
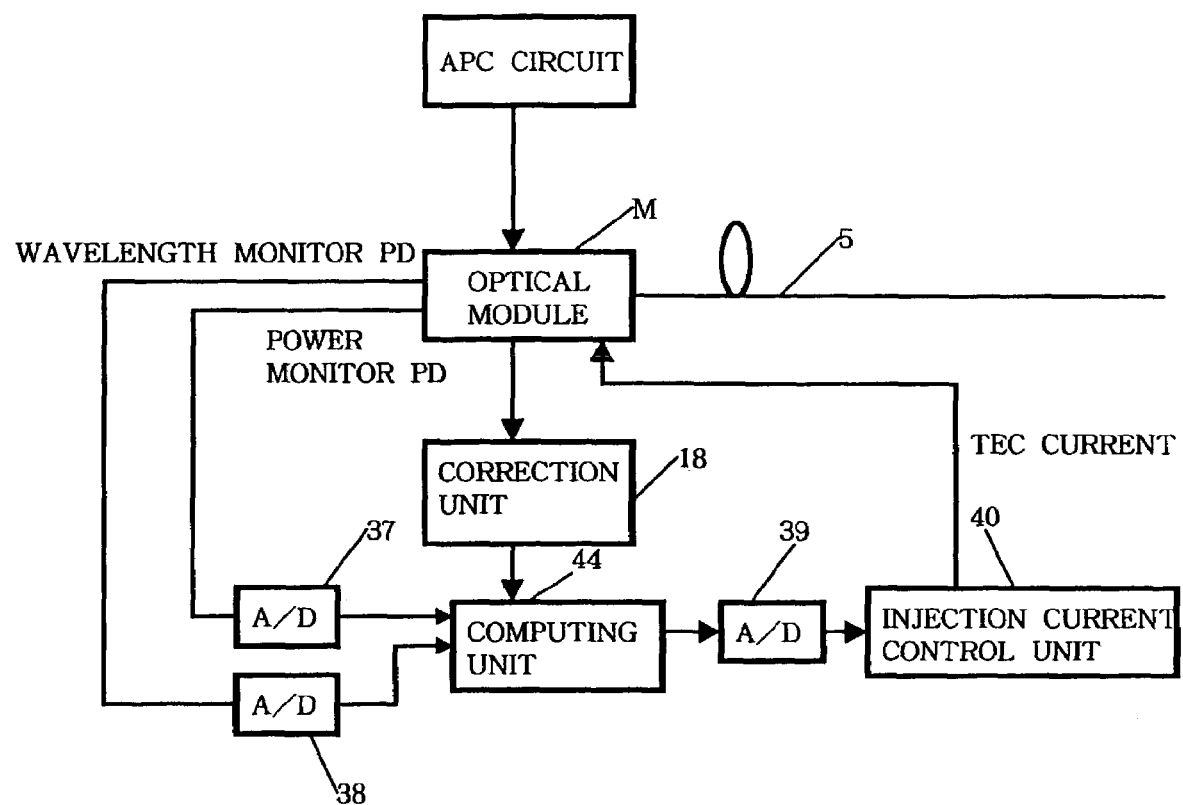
FIG. 10 is a block diagram showing a fourth embodiment of the present invention.

FIG. 10 is a block diagram showing a fourth embodiment of the present invention. As shown in FIG. 10, in a fourth embodiment, control is performed by using analog-digital conversion circuits 37, 38, and 39 in a control system. With the control method shown in FIG. 10, a signal generated based on a power monitor PD current and a wavelength monitor PD current is subjected to analog-digital conversion by the analog-digital conversion circuits 37 and 38. The converted signal is inputted into the comparator 16, and this comparator 16 computes a difference or ratio and outputs a control signal to an injection current control unit 40 through the analog-digital conversion circuit 39. The injection current control unit 40 controls an injection current to be injected into the light-emitting device 1 based on the inputted control signal and stabilizes the lasing wavelength of the light-emitting device 1.

According to the fourth embodiment, by feeding the signal from the wavelength monitor unit 2 back to the injection current, it becomes possible to fix the lasing wavelength of laser light outputted from the light-emitting device 1 at a predetermined wavelength.

Figure 11:
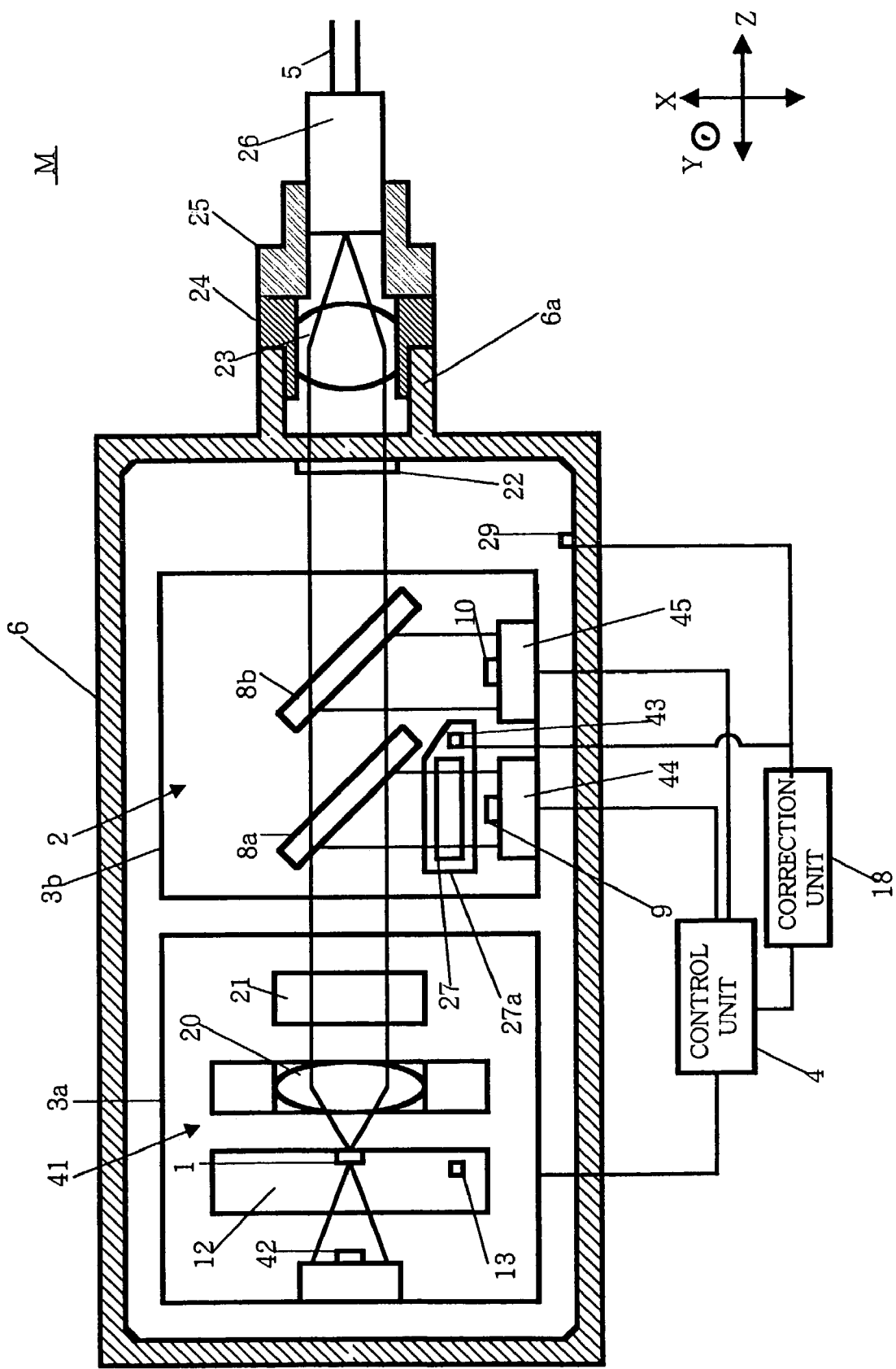
FIG. 11 is a plan cross-sectional view showing a semiconductor laser module in accordance with a third embodiment of the present invention.

FIG. 11 is a plan cross-sectional view showing a semiconductor laser module according to a fifth embodiment of the present invention.

As shown in FIG. 11, the fifth embodiment is characterized in that a wavelength monitor unit 2 is arranged on the front side (right-side in FIG. 11) with reference to a light-emitting unit 41 provided with a light-emitting device 1 and the temperatures of the wavelength monitor unit 2 and the light-emitting device 1 are controlled independently of each other.

The light-emitting unit 41 is provided with the light-emitting device 1 that outputs laser light, a collimating lens 20 that converts the laser light outputted from an output end surface on the front side (right-side in FIG. 11) of the light-emitting device 1 into parallel light, a photodiode 42 that receives the laser light outputted from an output end surface on the rear side (left-side in FIG. 11) of the light-emitting device 1 and monitors the light output, and an optical isolator 21 that cuts off light returning from the wavelength monitor unit 2 to the light-emitting device 1.

A light dividing device of the wavelength monitor unit 2 is constructed from a first half mirror 8a (first light dividing member) and a second half mirror 8b (second light dividing member) that are arranged in series along a Z-axis direction so that a predetermined distance is maintained therebetween.

The first half mirror 8a divides the laser light outputted from the light-emitting device 1 in a first direction (X-axis direction) on a first light-receiving device 9 side and a second direction (Z-axis direction) on a second half mirror 8b side. The second half mirror 8b divides the laser light from the first half mirror 8a in a third direction (X-axis direction) on a second light-receiving device 10 side and a fourth direction (Z-axis direction).

A first light-receiving device 9 and a second light-receiving device 10 are respectively fixed on a first PD carrier 44 and a second PD carrier 45.

The laser light divided in the fourth direction (Z-axis direction) by the second half mirror 8b is incident on an optical fiber 5 held by a ferrule 26 through a window portion 22 and a condensing lens 23, and is sent to the outside.

The light-emitting unit 41 is fixed on a first temperature adjustment unit 3a provided with a thermo module. Also, the wavelength monitor unit 2 is provided on a second temperature adjustment unit 3b, such as a thermo module, with a distance to the first temperature adjustment unit 3a maintained. With this construction, the temperature of the wavelength monitor unit 2 is controlled independently of the temperature of the light-emitting unit 41. The temperatures of the light-emitting unit 41 and the wavelength monitor unit 2 are controlled independently of each other in this manner, which makes it possible to perform control so that the light-emitting unit 41 and the wavelength monitor unit 2 are respectively placed in their optimum conditions.

The second temperature adjustment unit 3b, on which the wavelength monitor unit 2 is mounted, is controlled based on a detection signal from the optical filter temperature detection unit 43 that is placed on an optical filter holder 27a for detecting the temperature of an optical filter 27.

The first temperature adjustment unit 3a, on which the light-emitting unit 41 is mounted, is controlled based on a detection signal from a light-emitting device temperature detection unit 13 that is placed on an LD carrier 12 for detecting the temperature of the light-emitting device 1.

Also, a control unit 4 controls the first temperature control unit 3a so that the wavelength of the light-emitting device 1 is controlled based on wavelength information from the wavelength monitor unit 2. That is, after the wavelength of laser light is adjusted so as to be within a wavelength range, in which it is possible to adjust the wavelength using the wavelength monitor unit 2, based on the signal from the light-emitting device temperature detection unit 13, the control unit 4 adjusts the wavelength of the laser light so as to be within a predetermined wavelength based on a signal from the wavelength monitor unit 2.

Also, based on the signal from the optical filter temperature detection unit 43 and a temperature detection signal from a package temperature detection unit 29, a correction unit 18 outputs, to the control unit 4, a correction signal that commands the correction of wavelength shift caused by the temperature characteristic of the optical filter 27. The optical filter 27 is an optical component involving no power consumption and the temperature thereof depends on the temperatures of the temperature adjustment unit 3b and the package 6. Consequently, it is possible to correct the temperature of the optical filter 27 with high precision and to stabilize the lasing wavelength of laser light with high precision using the temperature detection units 43 and 29. As a result, it becomes possible to provide an optical module and an optical transmitter that are capable of reducing the signal degradation of an optical signal and are high in reliability.

It should be noted here that the first light-receiving device 9 and the second light-receiving device 10 are respectively fixed on different PD carriers in the example shown in FIG. 11, although they may be attached to the same attaching member.

In the case where the control of the temperature of the first temperature adjustment unit 3a and the detection of the temperature of the optical filter 27 are performed using a plurality of temperature detection units like in this embodiment, information from a separated temperature detection unit may be processed and controlled by an external control unit.

Figure 12:
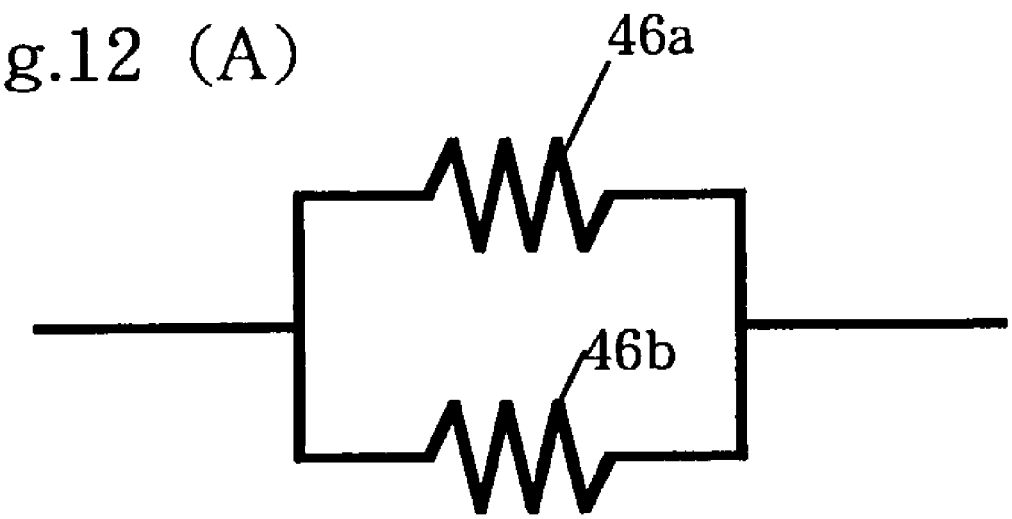
FIGS. 12A and 12B are circuit diagrams in a case where a thermistor is used as a temperature detection unit.
Figure 12:
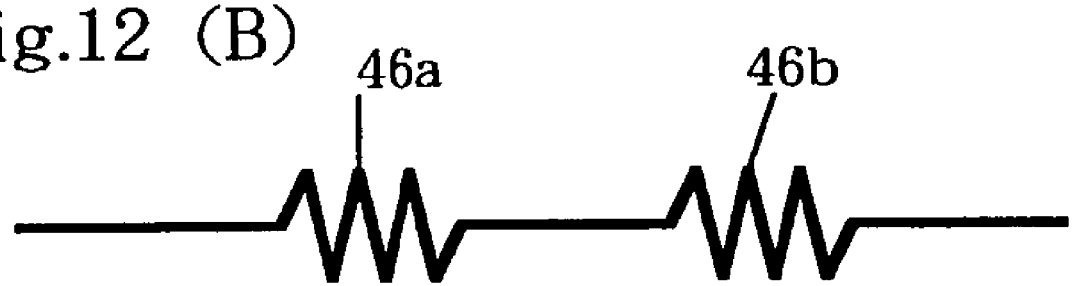

Also, in the case where a thermistor that detects a temperature based on the changing of a resistance value is used as the temperature detection unit, for instance, there may be used circuit constructions shown in FIGS. 12A and 12B. In these drawings, thermistors 46a and 46b are connected in parallel (see FIG. 12A) and are connected in series (see FIG. 12B). With these constructions, detection values are averaged. In this case, it becomes possible to reduce the number of terminals used within the package 6 and to perform control with an external control circuit that is the same as a circuit used to perform monitoring using one thermistor.

Figure 13:
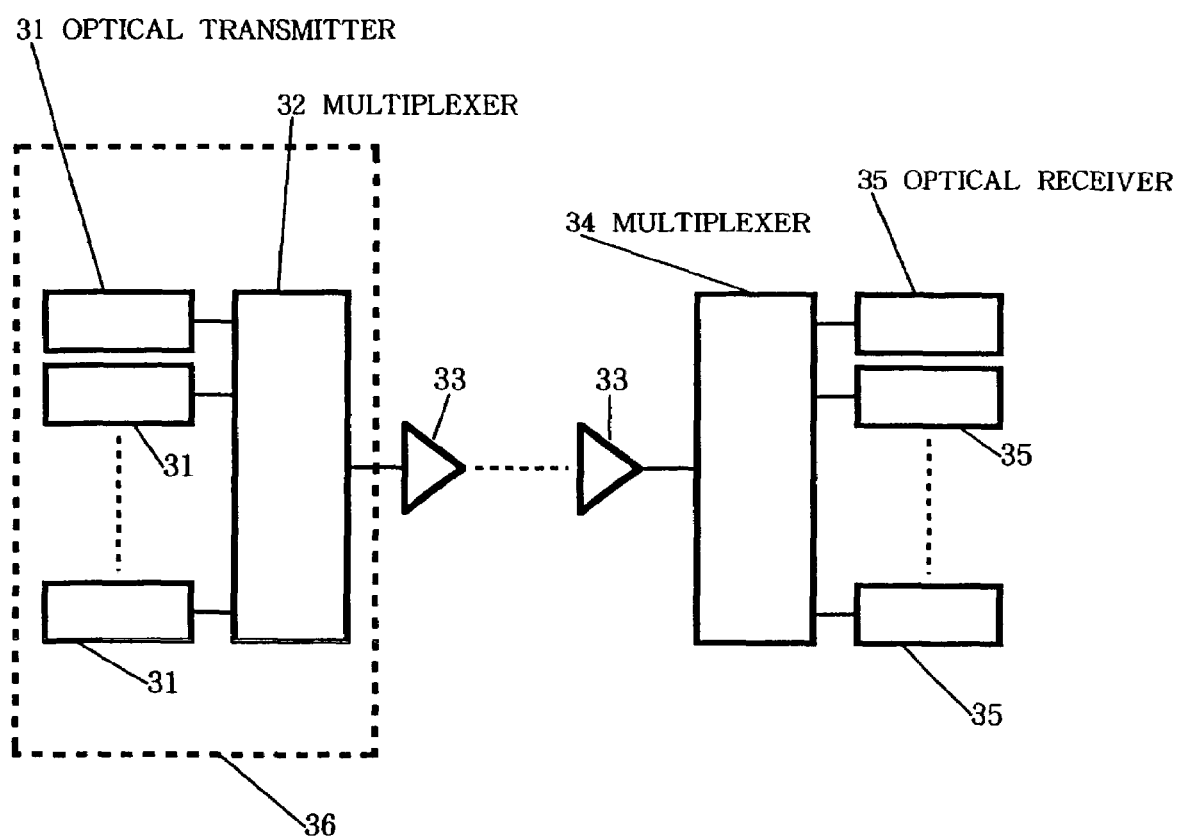
FIG. 13 is an explanatory drawing showing a WDM optical transmission apparatus applied to a wavelength division multiplexing communication system according to a sixth embodiment of the present invention.

FIG. 13 is an explanatory drawing showing a WDM optical transmission apparatus used in a wavelength division multiplexing communication system according to a sixth embodiment of the present invention.

As shown in FIG. 13, the wavelength division multiplexing communication system includes a plurality of optical transmitters 31 that each transmit an optical signal, a multiplexer 32 that wavelength-multiplexes optical signal transmitted from the optical transmitters 31 over a plurality of channels, a plurality of optical amplifiers 33 connected in a plurality of stages in order to amplify and relay multiplexed optical signals obtained as a result of the wavelength-multiplexing by the multiplexer 32, a splitter 34 that wavelength-separates the optical signals amplified by the optical amplifiers 33 for each channel, and a plurality of optical receivers 35 that receive respective optical signals that have been wavelength-separated by the splitter 34.

The WDM optical transmission apparatus 36 according to the sixth embodiment of the present invention includes the plurality of optical transmitters 31 according to the first to fourth embodiments and transmits optical signals outputted from these optical transmitters 31 while wavelength-multiplexing the optical signals. Accordingly, there is stabilized the wavelength of the optical signal oscillated from each optical transmitter 31, so that it becomes possible to construct a dense WDM system having high degree of reliability.

The present invention is not limited to the embodiments described above and it is possible to make various modifications without departing from technical scopes described in the appended claims. For instance, as a light dividing device, there may be used a beam splitter, such as a half mirror, in place of the prism 8.

Also, by utilizing a fact that a correlation also exists between the temperature characteristic of the light-emitting device 1 and the temperature characteristic of the optical filter 27, the correction unit 18 may correct wavelength shift caused by the temperature characteristic of the optical filter 27 by estimating the temperature of the optical filter 27 based on the temperature of the light-emitting device 1 detected by the light-emitting device temperature detection unit 13 as well as the package temperature detected by the package temperature detection unit 29.

According to the embodiments of the present invention, by utilizing a fact that a correlation exists between the package temperature and the temperature characteristic of the optical filter, the temperature of the optical filter is estimated by detecting the package temperature using the package temperature detection unit, and wavelength shift caused by the temperature characteristic of the optical filter is corrected based on the estimated temperature of the optical filter. Therefore, it becomes possible to stabilize the lasing wavelength of laser light with high precision for a long time period. As a result, it becomes possible to improve the reliability of the system.

Also, it is not required to separately provide a temperature detection unit that detects the temperature of the optical filter, so that there is not increased the number of components and the number of wirings. As a result, it becomes possible to simplify the construction of the optical module and to realize the reduction in cost.

What is claimed is:

1. An optical module comprising:
    a light-emitting device configured to output laser light;
    a wavelength adjustment unit configured to adjust a wavelength of the laser light outputted from the light-emitting device so as to be within a predetermined wavelength;
    a wavelength monitor unit configured to monitor the wavelength of the laser light outputted from the light-emitting device by receiving the laser light passed through an optical filter;
    a package configured to accommodate the light-emitting device, the wavelength adjustment unit, and the wavelength monitor unit therein; and
    a package temperature detection unit configured to detect a temperature of the package,
    wherein the wavelength adjustment unit is configured to adjust a light-emission wavelength of the light-emitting device so as to be within the predetermined wavelength range based on a signal outputted from the wavelength monitor unit, and
    wherein a signal from the package temperature detection unit is configured to correct the wavelength shift of the laser light caused by a temperature characteristic of the optical filter by estimating a temperature of the optical filter based on the detected temperature of the package.

2. The optical module according to claim 1, wherein the wavelength adjustment unit is configured to adjust the light-emission wavelength of the light-emitting device by adjusting a temperature of the light-emitting device.

3. The optical module according to claim 1, wherein the wavelength adjustment unit is configured to adjust the light-emission wavelength of the light-emitting device by adjusting an injection current injected into the light-emitting device.

4. The optical module according to claim 1, wherein a temperature of the wavelength monitor unit is adjusted on a temperature adjustment device.

5. The optical module according to claim 1, wherein the package temperature detection unit is arranged inside of the package.

6. The optical module according to claim 1, wherein the package temperature detection unit is arranged outside of the package.

7. The optical module according to claim 1, wherein the package temperature detection unit is arranged so as to thermally contact the package.

8. The optical module according to claim 1, wherein the package temperature detection unit detects a temperature of an upper surface of the package.

9. The optical module according to claim 1, wherein a temperature of the light-emitting device and a temperature of the wavelength monitor unit are controlled independently of each other.

10. The optical module according to claim 1, further comprising: a light-emitting device temperature detection unit configured to detect a temperature of the light-emitting device,
wherein after the wavelength of the laser light is adjusted so as to be within a wavelength range in which the wavelength is adjustable by the wavelength monitor unit, based on a signal from the light-emitting device temperature detection unit, the wavelength adjustment unit adjusts the wavelength of the laser light so as to be within the predetermined wavelength range based on a signal from the wavelength monitor unit, and
wherein the signal from the light-emitting device temperature detection unit and the signal from the package temperature detection unit are configured to correct wavelength shift caused by a temperature characteristic of the optical filter by estimating a temperature of the optical filter based on the temperature of the light-emitting device and the temperature of the package.

11. The optical module according to claim 1, further comprising:
a light-emitting device temperature detection unit configured to detect a temperature of the light-emitting device; and
an optical filter temperature detection unit configured to detect a temperature of the optical filter,
wherein after the wavelength of the laser light is adjusted so as to be within a wavelength range in which the wavelength is adjustable by the wavelength monitor unit, based on a signal from the light-emitting device temperature detection unit, the wavelength adjustment unit adjusts the wavelength of the laser light so as to be within the predetermined wavelength based on a signal from the wavelength monitor unit, and
wherein a signal from the optical filter temperature detection unit and the signal from the package temperature detection unit are configured to correct wavelength shift caused by a temperature characteristic of the optical filter based on the temperature of the optical filter and the temperature of the package.

12. An optical transmitter comprising:
an optical module including: a light-emitting device configured to output laser light; a wavelength adjustment unit configured to adjust a wavelength of the laser light outputted from the light-emitting device to be within a predetermined wavelength range; a wavelength monitor unit configured to monitor the wavelength of the laser light outputted from the light-emitting device by receiving the laser light passed through an optical filter; a package configured to accommodate accommodates the light-emitting device, the wavelength adjustment unit, and the wavelength monitor unit therein; and a package temperature detection unit configured to detect a temperature of the package;
a control unit configured to stabilize a light-emission wavelength of the light-emitting device to be within a predetermined wavelength range based on a signal outputted from the wavelength monitor unit; and
a correction unit configured to estimate a temperature of the optical filter based on the temperature of the package detected by the package temperature detection unit and configured to output, to the control unit, a correction signal commanding the correction of a shift of the wavelength caused by a temperature characteristic of the optical filter based on the estimated temperature of the optical filter.

13. A WDM optical transmission apparatus comprising a plurality of optical transmitters each of which comprises:
an optical module including: a light-emitting device configured to output laser light; a wavelength adjustment unit configured to adjust a wavelength of the laser light outputted from the light-emitting device into a predetermined wavelength; a wavelength monitor unit configured to receive the laser light outputted from the light-emitting device and passed through an optical filter and monitors the wavelength of the laser light; a package configured to accomodate the light-emitting device, the wavelength adjustment unit, and the wavelength monitor unit therein; and a package temperature detection unit configured to detect a temperature of the package;
a control unit configured to stabilize a light-emission wavelength of the light-emitting device to be within a predetermined wavelength range based on a signal outputted from the wavelength monitor unit; and
a correction unit configured to estimate a temperature of the optical filter based on the temperature of the package detected by the package temperature detection unit and configured to output, to the control unit, a correction signal commanding the correction of a shift of the wavelength caused by a temperature characteristic of the optical filter based on the estimated temperature of the optical filter,
wherein optical signals outputted from the plurality of optical transmitters are wavelength-multiplexed and transmitted.

14. An optical transmitter comprising:
output means for outputting laser light;
monitoring means for monitoring a wavelength of the laser light;
temperature adjustment means for adjusting a temperature of the monitoring means from at least one direction;
detection means for detecting a temperature of the temperature adjustment means;
detection means for detecting a temperature of a package covering the monitoring means; and
control means for controlling the wavelength of the laser light based on a signal from the monitoring means, a signal from the detection means for detecting the temperature of the temperature adjustment means, and a signal from the detection means for detecting the temperature of the package.

15. The optical transmitter according to claim 14, wherein:
the output means for outputting the laser light is an active component that requires power consumption with heat generation; and the monitoring means is a passive component.

16. The optical transmitter according to claim 14,
wherein the signal from the detection means for detecting the temperature of the temperature adjustment means and the signal from the detection means for detecting the temperature of the package are configured to correct the signal from the monitoring means.

17. A method of stabilizing a wavelength of laser light from a light-emitting device, said method comprising:
   emitting laser light by a the light-emitting device;
   monitoring the wavelength of the laser light outputted from said light-emitting device by receiving the laser light filtered through an optical filter;
   correcting a monitored signal based on a temperature of a package accommodating the optical filter, the correcting including correcting a shift of the monitored signal caused by a temperature characteristic of the optical filter based on the temperature of the package accommodating the optical filter and a temperature of an adjustment device on which the optical filter is mounted; and
   controlling the wavelength of the laser light from the light-emitting device based on the monitored signal that has been corrected.

* * * * *